United States Patent
Lee et al.

(10) Patent No.: US 9,698,021 B2
(45) Date of Patent: Jul. 4, 2017

(54) DEPOSITION METHODS OF FORMING A LAYER WHILE ROTATING THE SUBSTRATE IN ANGULAR INCREMENTS AND METHODS OF MANUFACTURING A SEMICONDUCTOR DEVICE USING THE SAME

(71) Applicant: SAMSUNG ELECTRONICS CO., LTD., Suwon-si, Gyeonggi-Do (KR)

(72) Inventors: Min-Joo Lee, Seoul (KR); Weon-Hong Kim, Suwon-si (KR); Moon-Kyun Song, Anyang-si (KR); Dong-Su Yoo, Seoul (KR); Soo-Jung Choi, Yangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/970,105

(22) Filed: Dec. 15, 2015

(65) Prior Publication Data
US 2016/0189951 A1    Jun. 30, 2016

(30) Foreign Application Priority Data

Dec. 30, 2014 (KR) ........................ 10-2014-0193004

(51) Int. Cl.
*H01L 21/28* (2006.01)
*H01L 21/02* (2006.01)
(Continued)

(52) U.S. Cl.
CPC .... *H01L 21/28194* (2013.01); *C23C 16/4584* (2013.01); *C23C 16/45544* (2013.01);
(Continued)

(58) Field of Classification Search
None
See application file for complete search history.

(56) References Cited

U.S. PATENT DOCUMENTS

| 7,950,348 B2 | 5/2011 | Sakai et al. |
| 8,071,452 B2 | 12/2011 | Raisanen |

(Continued)

FOREIGN PATENT DOCUMENTS

| JP | 2010-123752 A | 6/2010 |
| KR | 0600051 B1 | 7/2006 |

(Continued)

OTHER PUBLICATIONS

Definition of Natural Number, Wolfram MathWorld. Retrieved from WWW at http://mathworld.com/NaturalNumber.html on Feb. 4, 2017.*

*Primary Examiner* — Michael Jung
(74) *Attorney, Agent, or Firm* — Volentine & Whitt, PLLC

(57) ABSTRACT

In a method of forming a layer, a substrate is loaded into a chamber and placed at a home position that is a first relative angular position. A process cycle is performed a number of times while the substrate is at the home position. The cycle includes directing source gas onto the substrate at a first location adjacent the periphery of the substrate, purging the chamber, directing reaction gas onto the substrate from the first location, and purging the chamber. The cycle is performed another number of times while the substrate is at another relative angular position, i.e., at a position rotated about its general center relative from the home position.

20 Claims, 22 Drawing Sheets

(51) Int. Cl.
 C23C 16/455 (2006.01)
 C23C 16/458 (2006.01)
(52) U.S. Cl.
 CPC .... *H01L 21/0228* (2013.01); *H01L 21/02181* (2013.01); *H01L 21/02189* (2013.01); *H01L 21/02205* (2013.01)

(56) References Cited

U.S. PATENT DOCUMENTS

| | | |
|---|---|---|
| 8,544,411 B2 | 10/2013 | Toyoda et al. |
| 8,664,627 B1 | 3/2014 | Ishikawa et al. |
| 2005/0227442 A1* | 10/2005 | Ahn .................... C23C 16/405 438/287 |
| 2006/0150905 A1* | 7/2006 | Sakai .................... C23C 16/455 118/715 |
| 2009/0085156 A1 | 4/2009 | Dewey et al. |
| 2012/0076937 A1 | 3/2012 | Kato et al. |
| 2012/0248219 A1 | 10/2012 | Yoon et al. |
| 2013/0337658 A1 | 12/2013 | Ikegawa et al. |
| 2014/0179104 A1 | 6/2014 | Oshimo et al. |
| 2015/0099374 A1* | 4/2015 | Kakimoto ......... C23C 16/45534 438/791 |
| 2016/0222514 A1* | 8/2016 | Fujii ................... C23C 16/402 |
| 2016/0322218 A1* | 11/2016 | Fukiage ............ H01L 21/02274 |

FOREIGN PATENT DOCUMENTS

| | | |
|---|---|---|
| KR | 0675893 B | 2/2007 |
| KR | 2012-0087503 A | 8/2012 |
| KR | 1292399 B | 8/2013 |

* cited by examiner

1ST DIRECTION
⊗ — 2ND DIRECTION

2ND DIRECTION
↑
└→ 1ST DIRECTION

2ND DIRECTION
⊗ → 1ST DIRECTION

2ND DIRECTION
↑
└→ 1ST DIRECTION

1ST DIRECTION
⊗ ← 2ND DIRECTION

2ND DIRECTION
↑
└→ 1ST DIRECTION

DEPOSITION METHODS OF FORMING A LAYER WHILE ROTATING THE SUBSTRATE IN ANGULAR INCREMENTS AND METHODS OF MANUFACTURING A SEMICONDUCTOR DEVICE USING THE SAME

PRIORITY STATEMENT

This application claims priority under 35 USC §119 to Korean Patent Application No. 10-2014-0193004, filed on Dec. 30, 2014 in the Korean Intellectual Property Office (KIPO), the contents of which are hereby incorporated by reference in their entirety.

BACKGROUND

1. Field

The inventive concept relates to methods of forming layers such as in the manufacturing of semiconductor devices. More particularly, the inventive concept relates to atomic layer deposition (ALD) and to the manufacturing of semiconductor devices using the same.

2. Description of the Related Art

In a conventional traveling wave type ALD system a source gas and a reaction gas are introduced into a process chamber of the system from an inlet at one side of the process chamber and exhausted through an outlet at the other side of the chamber. Thus, a layer formed on a wafer in the process chamber may be to relatively thick on a portion of the wafer adjacent to the inlet of the chamber. That is, the ALD process may lead to a device having a high degree of wafer non-uniformity (WIWNU).

SUMMARY

According to an aspect of the inventive concept, there is provided a method of forming a layer, comprising: loading a substrate into a chamber and setting the substrate at a first relative angular position, performing a cycle n times while the substrate is at the first relative angular position, and performing the cycle m times while the substrate is at a second relative angular position at which the substrate is rotated by x degrees from the first relative angular position, and in which each cycle includes supplying source gas onto the substrate from a first location adjacent the outer periphery of the substrate, purging the chamber, supplying reaction gas onto the substrate from the first location, and purging the chamber, and in which n is a natural number greater than 1, x is a real number greater than 0 and less than 360, and m is a natural number less than n.

According to another aspect of the inventive concept, there is provided a method of forming a layer, comprising steps of: i) setting a substrate at a first relative angular position in a process chamber, ii) performing a cycle n times while the substrate is at the first relative angular position in the process chamber, the cycle including sequentially supplying, from a first location adjacent the periphery of the substrate, source gas, first purge gas, reaction gas, and second purge gas onto the substrate, wherein n is a natural number greater than 1, and iii) rotating the substrate $\{(360/a) \times (b)\}$ degrees to another relative angular position in a direction from the home position, and performing the cycle m times with the substrate set at the another relative angular position, wherein m is a natural number less than n, a is a natural number greater than 1, and b is a natural number, and in which step iii) is repeated until step iii) has been performed (a−1) times.

According to another aspect of the inventive concept, there is provided a method of forming a layer, comprising steps of: i) positioning a substrate at a home position in a process chamber, the substrate being at a first relative angular position when in the home position, ii) performing a number "n" of atomic layer deposition (ALD) cycles while the substrate remains fixed at said home position in the process chamber, iii) subsequently repositioning the substrate in the process chamber to another relative angular position at which the substrate is rotated about a geometrically central point of the substrate by an angle of x degrees relative to the home position, and iv) performing a number "m" of said ALD cycles while the substrate remains fixed at said another relative angular position in the process chamber, and in which n is a natural number greater than 1, x is greater than 0 and less than 360, and m is a natural number greater than one and not greater than n.

BRIEF DESCRIPTION OF THE DRAWINGS

The inventive concept will be more clearly understood from the following detailed description taken in conjunction with the accompanying drawings.

FIG. 1 is a cross-sectional view of an atomic layer deposition (ALD) apparatus used for carrying out methods of forming a layer in accordance with the inventive concept;

FIGS. 2 and 3 are conceptual diagrams illustrating a method of forming the layer in accordance with the inventive concept, with each of FIGS. 2 and 3 being plan views of a wafer during the course of the method;

FIG. 4 is a plan view of a substrate during the course a Comparative Example of a method of forming a layer on a wafer;

FIG. 5 is a conceptual diagram comprising plan views of wafers illustrating thickness distributions of layers formed on the wafers by Examples 1 and 2 of a method according to the inventive concept and by a Comparative Example;

FIG. 6 is a graph illustrating thickness distributions of hafnium oxide layers formed on the wafer W by Examples 1 and 2 in accordance with the inventive concept and by Comparative Example;

FIG. 7 is a graph illustrating thickness distributions of hafnium oxide layers formed on the wafer W by Example 1 in accordance with the inventive concept but for different numbers of cycles; and FIGS. 8 to 34 illustrate a method of manufacturing a semiconductor device in accordance with the inventive concept, with FIGS. 8, 10, 13, 15, 19, 22, 25, 28 and 31 being plan views of the device during the course of its manufacture, FIGS. 11, 14, 16, 18, 20, 23, 26, 29 and 32 being cross-sectional views taken along lines A-A' of corresponding ones of the plan views, FIGS. 9, 17, 21, 24 and 33 being cross-sectional views taken along lines B-B' of corresponding ones of the plan views, respectively, and FIGS. 12, 27, 30 and 34 being cross-sectional views taken along lines C-C' of corresponding ones of the plan views, respectively.

DETAILED DESCRIPTION

Figure 1:
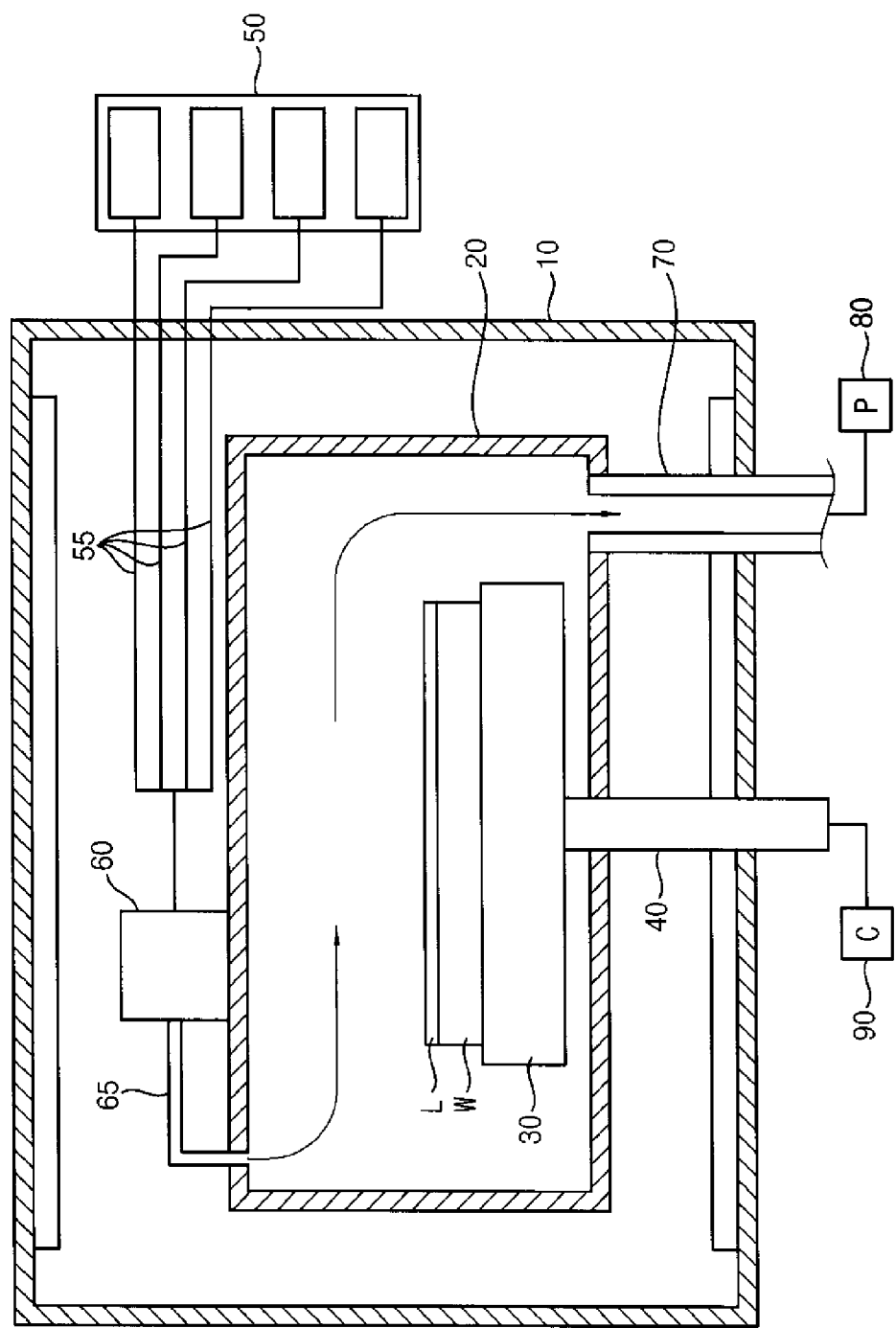
FIGS. 1 to 34 represent non-limiting, examples of the inventive concept.

The inventive concept will be described more fully hereinafter with reference to the accompanying drawings. The inventive concept may, however, be embodied in many different forms and should not be construed as limited to the examples set forth herein. Rather, these examples are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The inventive concept is described herein with reference to schematic illustrations of idealized examples (and intermediate structures). As such, variations from the shapes of the illustrations as a result, for example, of manufacturing techniques and/or tolerances, are to be expected. Thus, examples of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
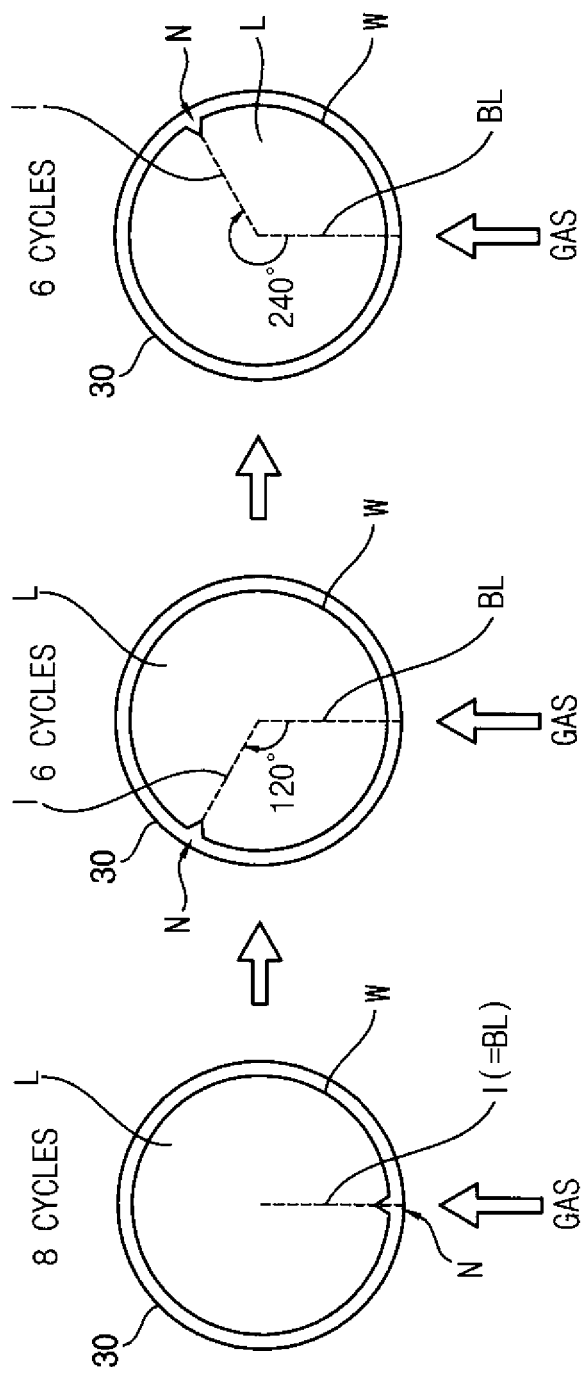
Figure 3:
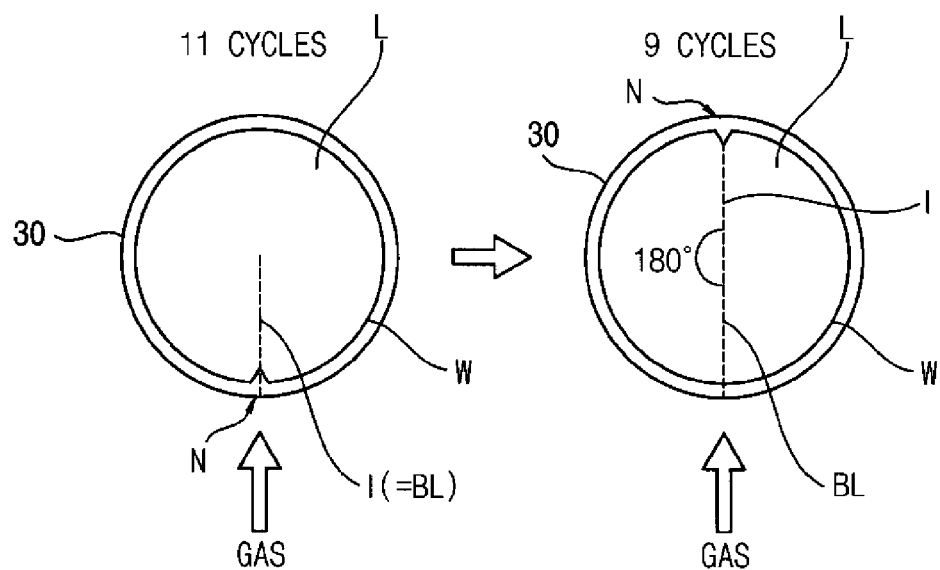

FIG. 1 is a cross-sectional view illustrating an atomic layer deposition (ALD) apparatus which may be used to carry out methods of forming a layer in accordance with the inventive concept, and FIGS. 2 and 3 illustrate one such method.

Referring to FIG. 1, the ALD apparatus may include an outer chamber 10, an inner chamber 20, a susceptor 30, a drive shaft 40, a gas tank 50, a flow ratio controller 60, an exhaust pipe 70, an exhaust pump 80 and a controller 90. The ALD apparatus may further include first and second gas supply lines 55 and 65.

The inner chamber 20 is disposed inside the outer chamber 10, and may contain the susceptor 30 onto which a substrate may be loaded.

The susceptor 30 may be moved up and down or rotated in the inner chamber 20 by the drive shaft 40 under the susceptor 30. The substrate loaded onto the susceptor 30 may be, for example, a circular wafer W. Various types of layers L may be deposited on the wafer W.

The movement or the rotation of the drive shaft 40 may be controlled by the controller 90.

The gas tank 50 may be disposed outside the outer chamber 10, and may include tanks in which an etching gas, a reaction gas, a purge gas, etc., may be stored.

The gases stored in the gas tank 50 may be supplied to the flow ratio controller 60 in the outer chamber 10 through the first gas supply lines 55. The gases may then be supplied into the inner chamber 20, i.e., at flow rates controlled by the flow ratio controller 60, through the second gas supply line 65.

The second gas supply line 65 may be disposed over the top of the inner chamber 20, and thus the etching gas, the reaction gas and the purge gas may be supplied into the inner chamber 20 through the second gas supply line 65 adjacent one side of a wafer W loaded on the susceptor 30. The gases may flow toward the other side of the wafer W, i.e., to a location diametrically opposite the side of the wafer W that first receives the gases, and may be exhausted from a lower portion of the inner chamber 20 adjacent to the second side of the wafer W through the exhaust pipe 70. The exhaust pipe 70 extends to the outside of the outer chamber 10. The exhaust pump 80 is connected to the exhaust pipe 70 to draw the gases through the exhaust pipe 70.

Thus, the ALD apparatus illustrated above may be a traveling wave type ALD apparatus.

An electrode (not shown) may be disposed inside the outer chamber 10 or an RF power source (not shown) may be disposed outside the outer chamber 10 so that plasma may be generated from the gases supplied into the inner chamber 20.

Referring now to FIGS. 1 and 2, in one example (referred to hereinafter as "Example 1") of a method of forming a layer in accordance with the inventive concept, a substrate, e.g., a wafer W, is loaded into the inner chamber 20 and onto the susceptor 30 as disposed at a standard angle.

For example, a notch N of the wafer W may be placed on an imaginary baseline BL such that an imaginary indication line I connecting a center of the wafer W to the notch N of the wafer W coincides with the baseline BL. In this example, the standard angle is a reference angle of 0 degrees with respect to the baseline BL. The wafer W may be considered to be at a first relative angular position or "home position" when the indication line coincides with the baseline BL.

Once the wafer W is set at the home position, a plurality of ALD cycles is performed.

For example, each cycle includes directing a source gas onto the wafer W, purging the inner chamber 20, directing a reaction gas onto the wafer W, and purging the inner chamber 20 again. The purging of the inner chamber 20 may be performed by supplying a purge gas into the inner chamber 20. The purge gas comprises inactive gas, e.g., nitrogen, argon, neon, etc. The reaction gas may comprise water vapor ($H_2O$).

The source gas may be a hafnium-based source gas, e.g., hafnium chloride ($HfCl_4$), or a zirconium-based source gas, e.g., zirconium-chloride ($ZrCl_4$) gas, or the like. That is, the method may form a high-k dielectric layer; however, the present inventive concept is not be limited thereto, and may be applied to the forming of various other types of layers.

As described above, the ALD apparatus may be a traveling wave type ALD apparatus in which the source gas, the purge gas and the reaction gas are mainly directed onto the periphery of a substrate (wafer W in this example) at a first location, i.e., at one side of the substrate, and flow across the surface of the substrate diametrically to the other side of the substrate, i.e., in a direction passing through the geometric center of the substrate. Thus, the thickness of a layer L formed on the wafer W may be greatest at a portion of the wafer W closest to the first location.

The wafer W is then repositioned to a second relative angular position rotated by, for example, rotating the wafer W by about 120 degrees clockwise. Using the apparatus illustrated in FIG. 1, the susceptor 30 is rotated by rotating the drive shaft 40 under the control of the controller 90. Accordingly, the wafer W on the susceptor 30 is also rotated, and thus the wafer W may be placed such that the indication line I is about 120 degrees from the baseline BL. The term "about" in this instance accounts for any slight variations as the result of calibration errors or the like in the apparatus.

Then, a second ALD step including a plurality of ALD cycles may be performed

The layer L formed as a result of the second step may be thickest at a portion of the wafer W closest to a location on the periphery of the wafer W disposed about 120 degrees counter-clockwise by from the first location.

The wafer W is then rotated again and set at a position about 240 degrees from the home position. In this example, therefore, the wafer W is repositioned so that the indication line I is about 240 degrees clockwise from the baseline BL, and thus the wafer W may be disposed at a third relative angular position that is about 240 degrees with respect to the baseline BL.

Then a third ALD step including a plurality of ALD cycles may be performed.

Accordingly, the layer L formed by the third ALD step is thickest at a portion of the wafer W closest to a location along the periphery of the wafer W that is about 240 degrees counter-clockwise from the first location.

As a result, in the example of the process described above, the gases provided in the ALD cycles are mainly supplied onto the wafer W at three evenly distributed positions along the periphery of the wafer W. Therefore, the final layer L formed on the wafer W may have a uniform thickness.

To this, end, in the above-described example of the inventive concept, the number of ALD cycles in the first step is greater than the number of ALD cycles in each of the second and third steps. For example, when the ALD process includes 20 cycles in total as determined to produce a layer L of a desired thickness, the first, second and third steps may include 8 of the twenty ALD cycles, 6 of the twenty ALD cycles and another 6 of the twenty ALD cycles, respectively. However, the present inventive concept may not be limited thereto, and the first to third steps may include other numbers of ALD cycles as long as the number of ALD cycles of the first step is greater than the number of ALD cycles of each of the second and third steps.

In other examples, the method of forming a layer according to the inventive concept includes only 2 steps of ALD cycles. In still other examples, the method of forming a layer according to the inventive concept includes more than 3 steps of ALD cycles.

As is clear from the description above, each (ALD) step (referred to hereinafter simply as a "step") consists of performing a plurality of ALD cycles while the substrate (wafer W) remains fixed at a respective angular position relative to the location at which the gases used in the ALD are supplied into the process chamber and/or onto the substrate. That is, the ALD process may include "a" numbers of steps ("a" being a natural number more than 1), and all cycles of each step may be performed with the wafer W is at a relative angular position of about 360/a degrees from the position that the wafer W assumed during the previous step. For example, when the ALD process includes a total of 4 steps, the first step may be performed while the wafer W is at the home position (with angle "a" being the standard angle), a second step may be performed while the wafer W is at a position rotated clockwise by an angle of about 90 degrees from the standard angle, a third step may be performed while the wafer W is at a position rotated clockwise by an angle of about 180 degrees from the standard angle, and a fourth step may be performed while the wafer W is at a position rotated clockwise by angle of about 270 degrees from the standard angle. For example, the ALD process may includes 22 total ALD cycles with the first to fourth steps including 7 cycles, 5 cycles, 5 cycles and 5 cycles, respectively.

FIG. 3 illustrates an example in which a layer L is formed by an ALD process having only 2 steps (Example 2). With the wafer W at the home position, a first step including 11 cycles may be performed, and after rotating the wafer W by angle of about 180 degrees from the home position, a second step including 9 cycles may be performed. The numbers of ALD cycles of each of the steps is not limited to those noted above. That is, the steps of Example 2 may include other numbers of ALD cycles, e.g., 12 cycles/8 cycles or 13 cycles/7 cycles as long the first step includes more numbers of ALD cycles than the second step.

However, in other examples of a method of forming a layer according to the inventive concept, the steps of the ALD process, e.g., first and second steps, may have the same numbers of ALD cycles, although these examples may yield a final layer that is not as uniformly thick as those of the examples in which the steps of the ALD process have different numbers of ALD cycles.

Figure 4:
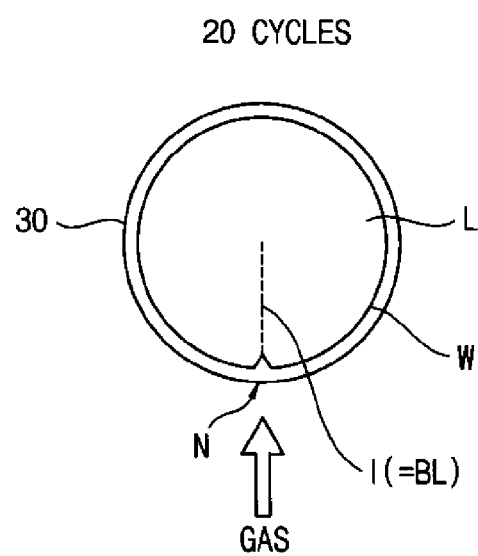

FIG. 4 illustrates a method of forming a layer (Comparative Example) that serves as an example for comparison with methods according to the inventive concept.

Referring to FIG. 4, with the wafer W at a standard angle, all of the cycles of the ALD process are performed. In Comparative Example, 20 ALD cycles are performed.

Wafer non-uniformity (WIWNU) between the methods of forming the layers in accordance with Examples 1 and 2 and Comparative Example will now be described. For purposes of comparison, a method of forming a layer in accordance with Example 1 has an ALD process consisting of first, second and third steps of 8 ALD cycles, 6 ALD cycles and 6 ALD cycles, respectively. A method of forming a layer in accordance with Example 2 has an ALD process consisting of first and second steps of 10 cycles and 10 cycles, respectively. A method of forming a layer in accordance with the Comparative Example has an ALD process consisting of one step of 20 ALD cycles.

Figure 5:
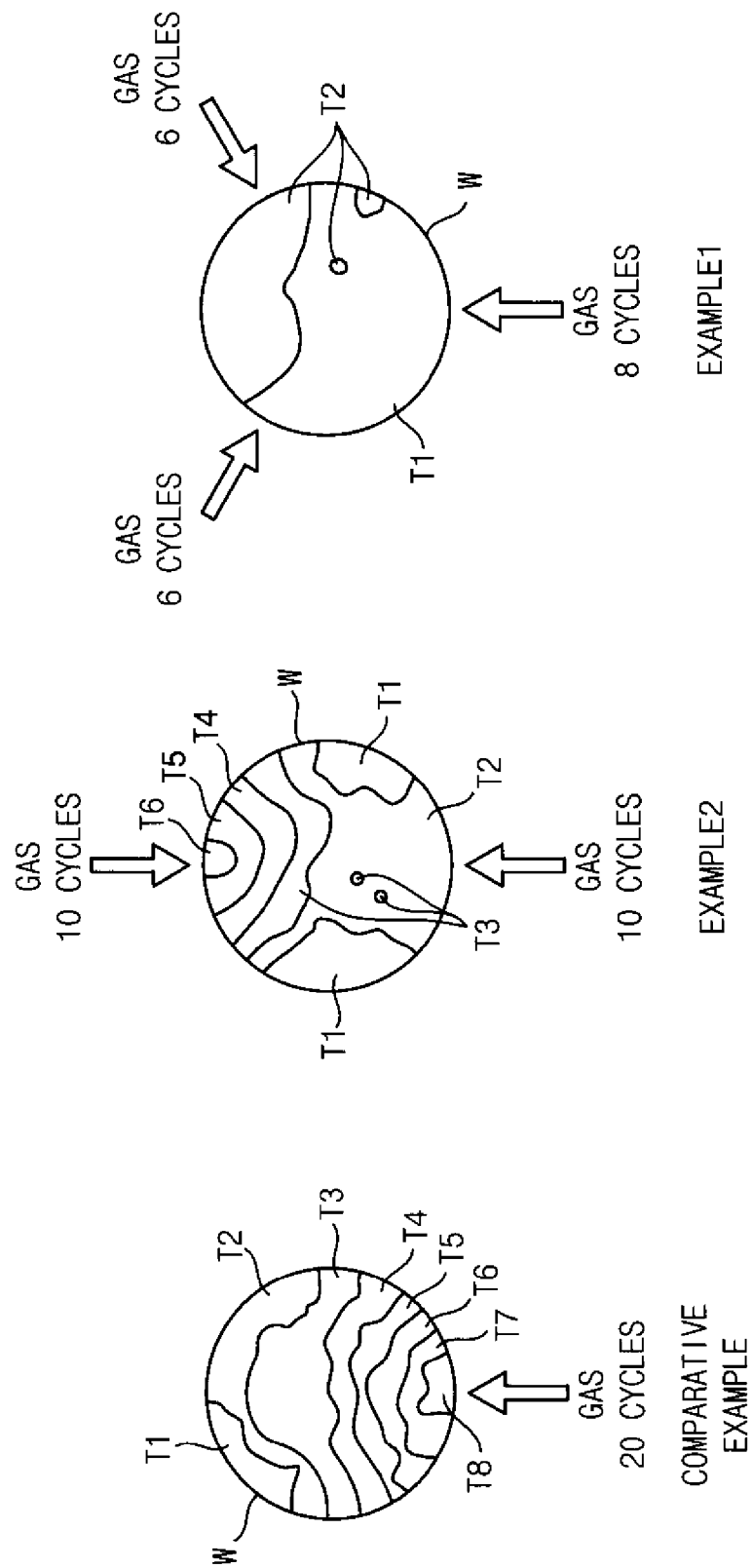

FIG. 5 illustrates the thickness distributions of layers formed on wafers W in accordance with Examples 1 and 2 and the Comparative Example.

Referring to FIG. 5, in the Comparative Example, the layer had only first to eighth thicknesses T1, T2, T3, T4, T5, T6, T7 and T8 different from each other. In particular, the portion of the layer with the greatest thickness T8 resided on a portion of the wafer W adjacent the location from which gases were mainly supplied onto the surface of the wafer W.

In the Example 2, the layer had only first to sixth thicknesses T1, T2, T3, T4, T5 and T6 different from each other. Accordingly, the thickness distribution was less than that of the layer formed by the Comparative Example, i.e., the thickness of the layer was more uniform than the layer formed in the Comparative Example. In this case, the layer was thickest on portions of the wafer W adjacent opposite sides of the wafer W, i.e., at the two locations where gases were mainly supplied onto the surface of the wafer. Furthermore, because the steps included the same number of ALD cycles, the thickness of the layer on a first portion of the wafer W adjacent the periphery thereof and at which the gases were supplied onto the surface of the wafer W in the first step was less than the thickness of the layer on a second portion of the wafer W adjacent the periphery thereof and at which the gases were supplied onto the surface of the wafer in the second step.

Thus, the thicknesses of the layers formed on the wafer W by Examples 1 and 2 were more uniform than that of the layer formed by Comparative Example. Moreover, in Example 1, the layer had only first and second thicknesses T1 and T2 that were different from each other, and was the layer that was most uniform on the wafer W.

Figure 6:
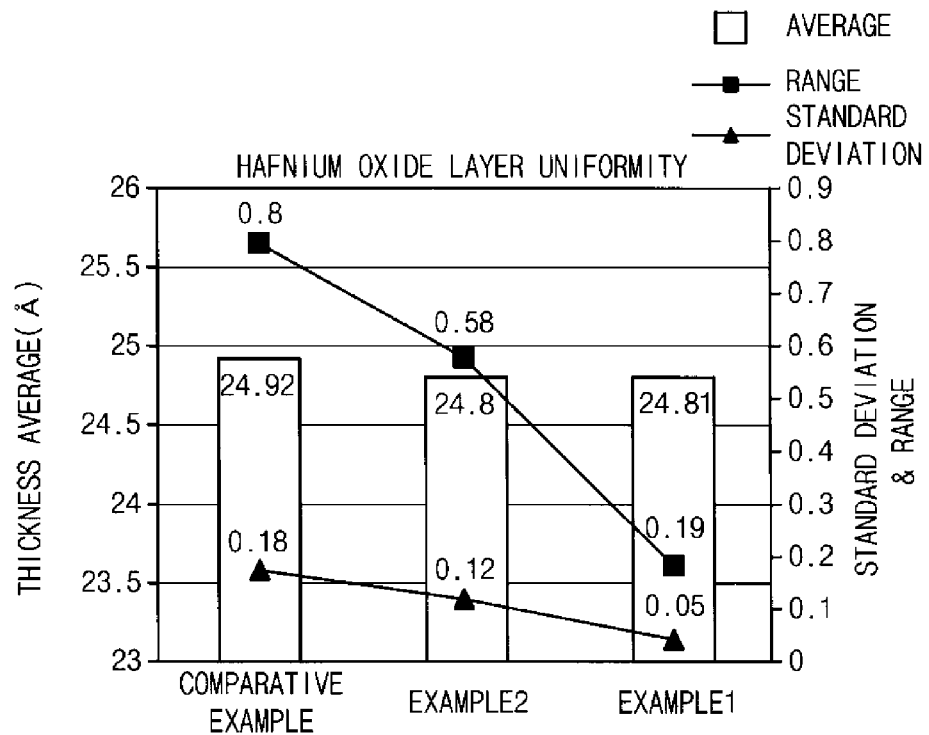
Figure 7:
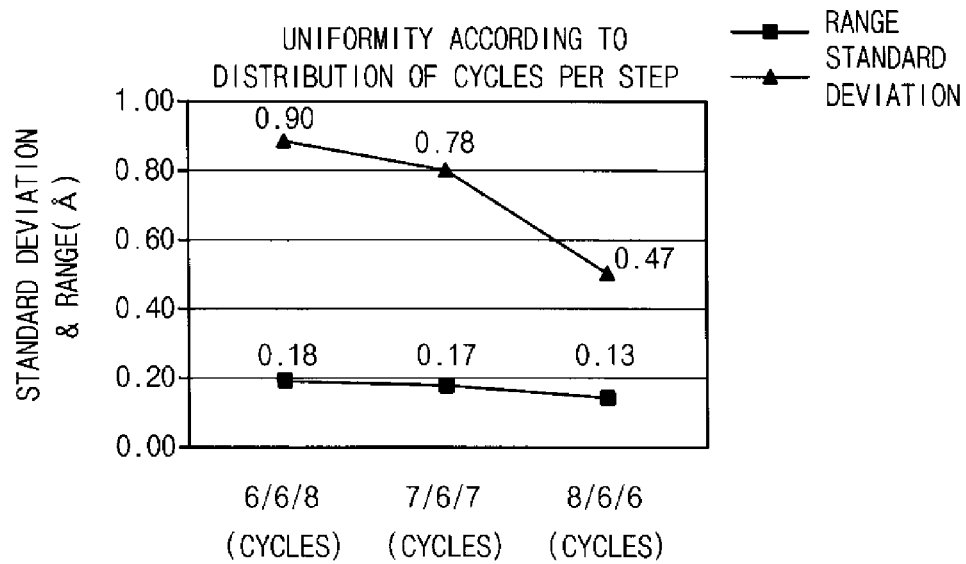

FIG. 6 is a graph illustrating thickness distributions of hafnium oxide layers formed on the wafer W by Examples 1 and 2 and the Comparative Example, and FIG. 7 is a graph illustrating thickness distributions of hafnium oxide layers formed on the wafer W by Example 1 but for different cases of numbers of ALD cycles in each the steps.

Referring to FIG. 6, the thickness distributions of the hafnium oxide layers of Examples 1 and 2 were better than that of the hafnium oxide layer of Comparative Example with respect to average, standard deviation, and range.

FIG. 7 shows that the thickness distribution of the hafnium oxide layer was best when the first to third steps included 8 cycles, 6 cycles and 6 cycles, respectively. That is, the results of FIG. 7 show that the thickness distribution of the hafnium oxide layer was better when the first step included more cycles than other steps.

As illustrated above, when a layer is formed by an ALD process using a traveling wave type ALD apparatus in which gases are mainly supplied onto a surface of a wafer W at a first location along the periphery of the wafer W, and in a direction that causes the gas to flow diametrically across the surface toward a second location diametrically opposite the first location, the total number of cycles of the ALD process may be divided and with several of the ALD cycles being carried out in a number of different steps each performed while the wafer is at a different relative angular position with respect to a standard of home position. Accordingly, the thickness of the layer formed may be highly uniform across the entire surface of the wafer W.

Additionally, in consideration that the layer may be formed relatively thinly at an initial part of an ALD process, the first step may include more cycles than the subsequent steps, so as to ensure that the layer has a highly uniform thickness.

An example of a method of manufacturing a semiconductor device in accordance with the inventive concept will now be described in detail with reference to FIGS. 8 to 34.

Figure 8:
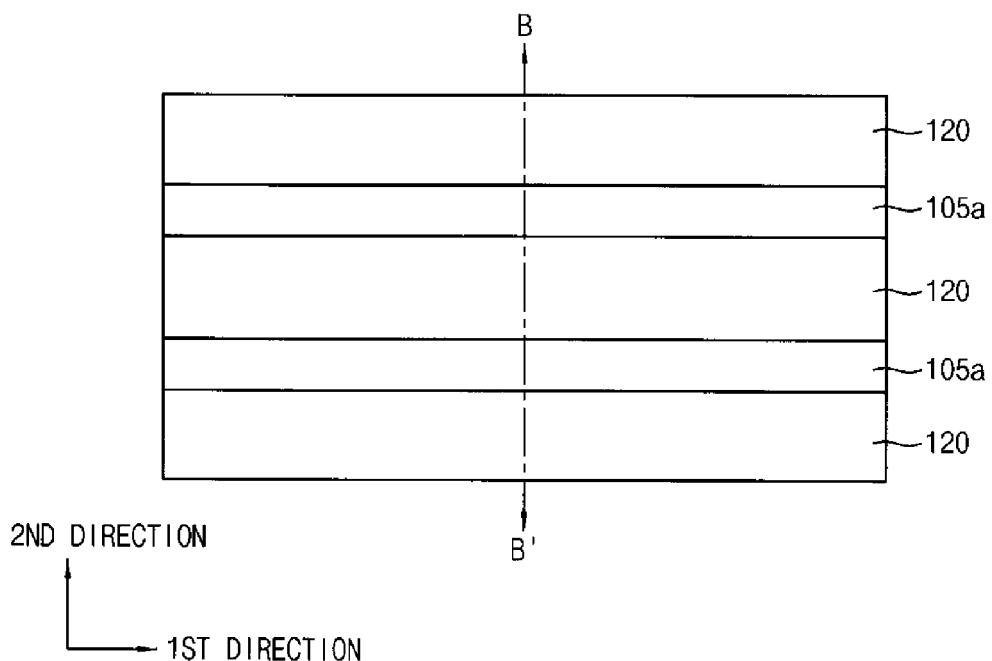
Figure 9:
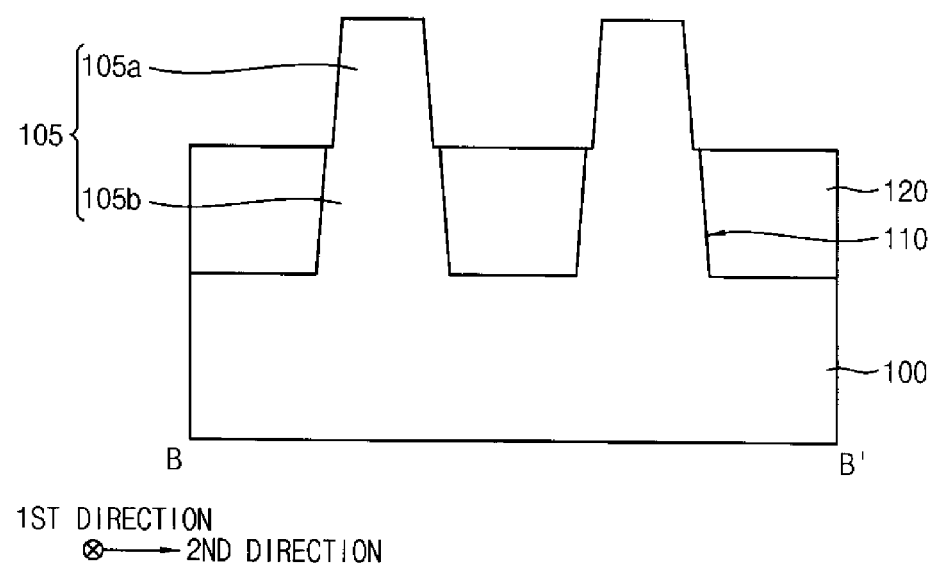

Referring to FIGS. 8 and 9, an upper portion of a substrate 100 may be partially etched to form a trench 110, and an isolation layer 120 may be formed to fill a lower portion of the trench 110.

The substrate 100 may comprise silicon, germanium, silicon-germanium, or a Group III-V semiconductor compound, e.g., GaP, GaAs, GaSb, etc. For example, the substrate 100 may be a silicon-on-insulator (SOI) substrate or a germanium-on-insulator (GOI) substrate.

An ion implantation process may be performed to form a well (not shown) in the substrate 100 before the trench 110 is formed. The well may be formed by doping the substrate with p-type impurities, e.g., boron, aluminum, or the like. Alternatively, the well may be formed by doping the substrate with n-type impurities, e.g., phosphorus, arsenic, or the like.

The isolation layer 120 may be formed by forming an insulation layer on the substrate 100 to sufficiently fill the trench 110, planarizing the insulation layer until a top surface of the substrate 100 is exposed, and removing an upper portion of the insulation layer to expose an upper portion of the trench 110. When the upper portion of the insulation layer is removed, an upper portion of the substrate 100 adjacent thereto may be also removed to reduce the thickness of the substrate. The insulation layer may be formed of an oxide, e.g., silicon oxide.

Accordingly, a field region having a top surface covered by the isolation layer 120 and an active region having a top surface not covered by the isolation layer 120 may be defined in the substrate 100. The active region may have a fin-like shape protruding from an upwardly facing surface of substrate 100, and thus may be referred to as an active fin 105. The active fin 105 may have a lower portion 105b whose sides are covered by the isolation layer 120, and an upper portion 105a whose sides are exposed.

The active fin 105 may extend in a first direction substantially parallel to a top surface of the substrate 100, and a plurality of active fins 105 may be formed as spaced form each other in a second direction substantially parallel to the top surface of the substrate 100 and crossing the first direction. In one example, the first and second directions cross each other at a right angle.

Figure 10:
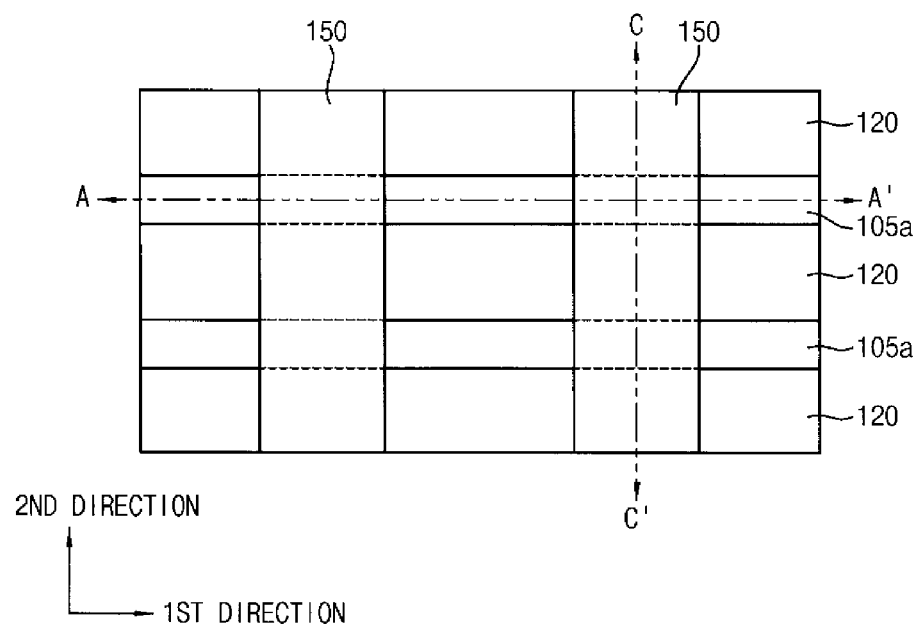
Figure 11:
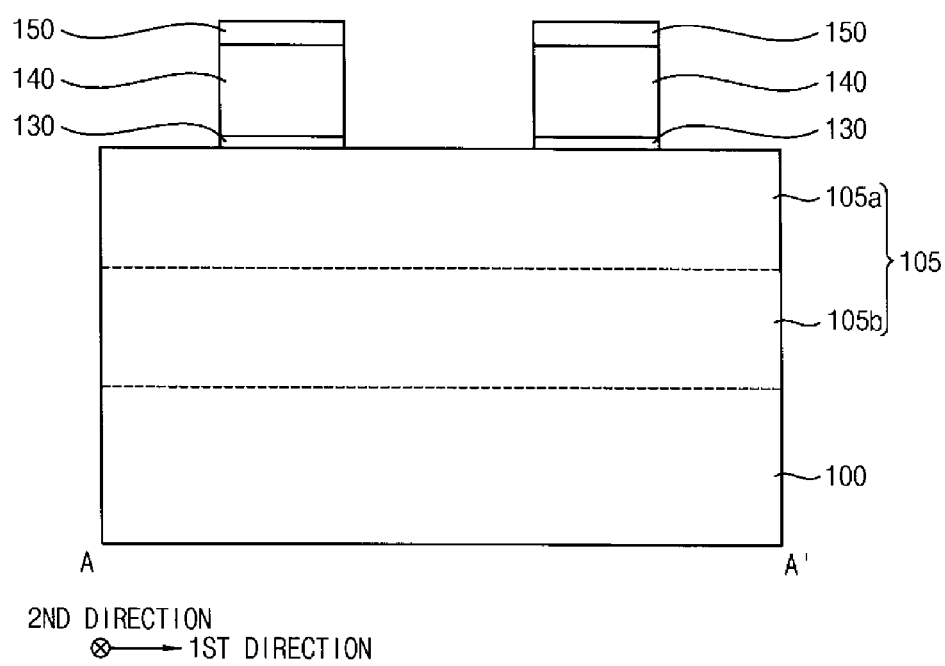
Figure 12:
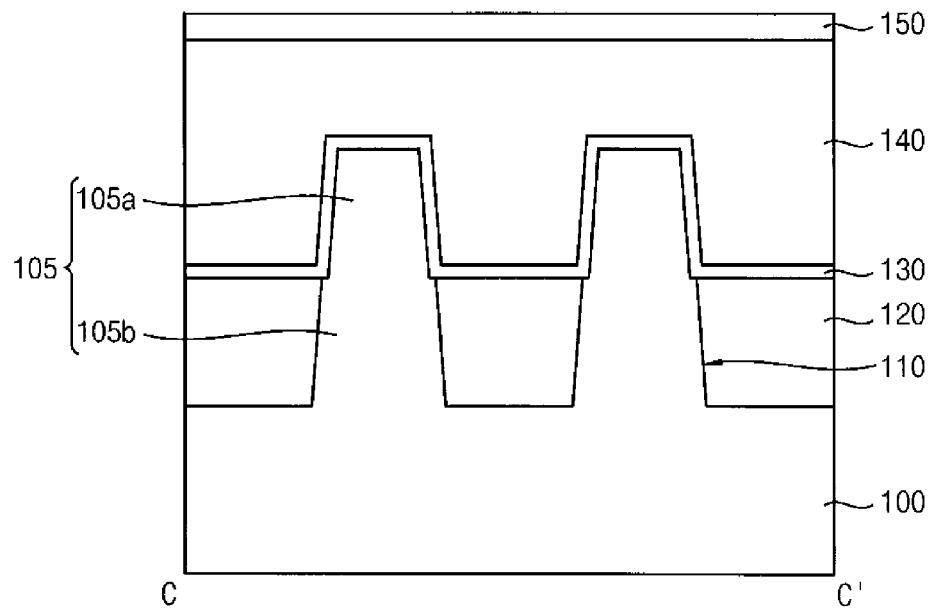

Referring to FIGS. 10 to 12, a dummy gate structure may be formed on the substrate 100.

The dummy gate structure may be formed by sequentially stacking a dummy gate insulation layer, a dummy gate electrode layer and a dummy gate mask layer on the active fin 105 of the substrate 100 and the isolation layer 120, patterning the dummy gate mask layer by a photolithography process using a photoresist pattern (not shown) to form a dummy gate mask 150, and sequentially etching the dummy gate electrode layer and the dummy gate insulation layer using the dummy gate mask 150 as an etching mask. Thus, the dummy gate structure may be formed to include a dummy gate insulation layer pattern 130, a dummy gate electrode 140 and the dummy gate mask 150 sequentially stacked on the active fin 105 of the substrate 100 and a portion of the isolation layer 120 adjacent thereto in the second direction.

The dummy gate insulation layer may be formed of an oxide, e.g., silicon oxide, the dummy gate electrode layer may be formed of polysilicon, for example, and the dummy gate mask layer may be formed of a nitride, e.g., silicon nitride. The dummy gate insulation layer, the dummy gate electrode layer, and the dummy gate mask layer may be formed by a chemical vapor deposition (CVD) process, an atomic layer deposition (ALD) process, or the like. Alternatively, the dummy gate insulation layer may be formed by a thermal oxidation process on an upper portion of the substrate 100.

The dummy gate structure formed on the active fins 105 of the substrate 100 and the isolation layer 120 may extend in the second direction, and a plurality of dummy gate structures may be formed as spaced apart from each other in the first direction.

After forming the dummy gate structure, an ion implantation process may be performed to form a halo region (not shown) and a lightly doped drain (LDD) region in the substrate 100. In one such example, the halo region is formed by doping the active fin 105 with p-type impurities, e.g., boron, aluminum, or the like, and the LDD region is formed by doping the active fin 105 with n-type impurities, e.g., phosphorus, arsenic, or the like. Alternatively, the halo region may be formed by doping the active fin with n-type impurities, and the LDD region may be formed by doping active fin with p-type impurities.

Figure 13:
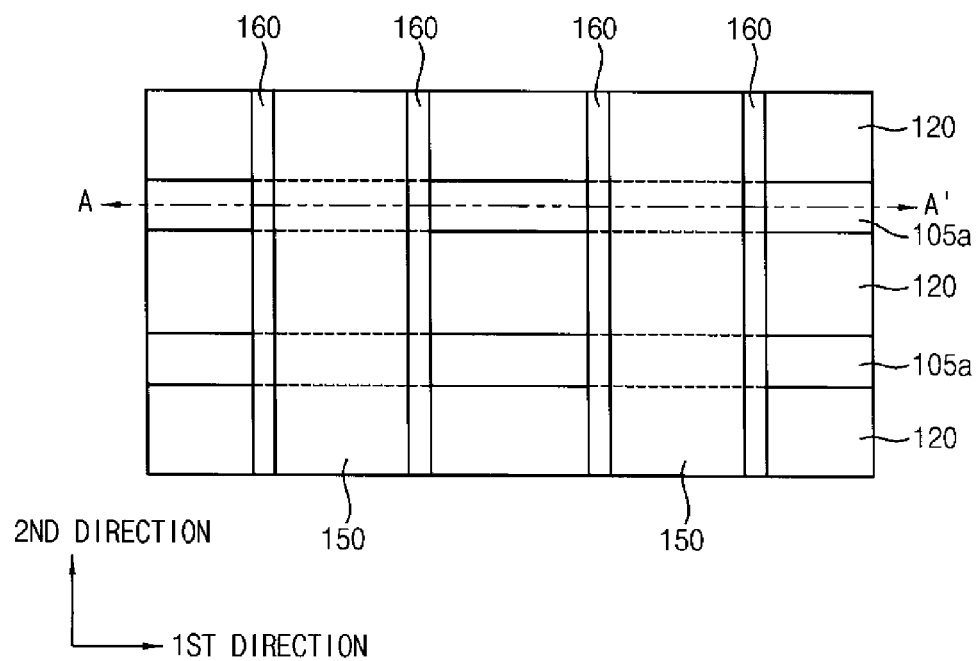
Figure 14:
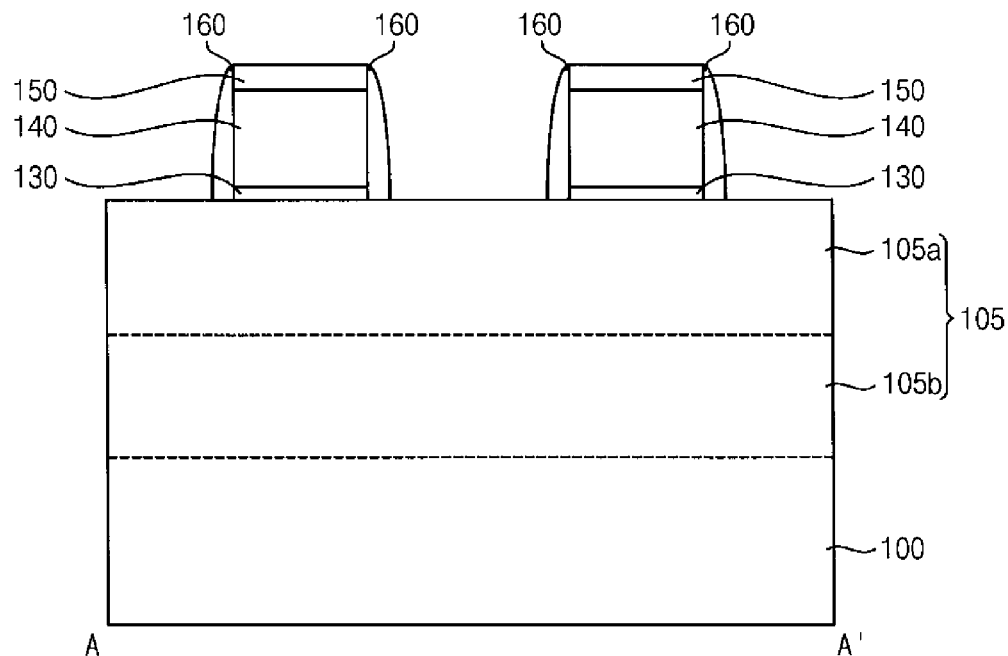

Referring to FIGS. 13 and 14, a gate spacer 160 may be formed on sides of the dummy gate structure, and a fin spacer (not shown) may be also formed on sides of the active fin 105.

The gate spacer 160 may be formed by forming a spacer layer on the dummy gate structure, the active fin 105 and the isolation layer 120, and anisotropically etching the spacer layer. The spacer layer may be formed of a low-k dielectric material including oxygen, e.g., silicon oxynitride, silicon oxycarbonitride or the like.

The gate spacer 160 may be formed on both sides of the dummy gate structure in the first direction.

Figure 15:
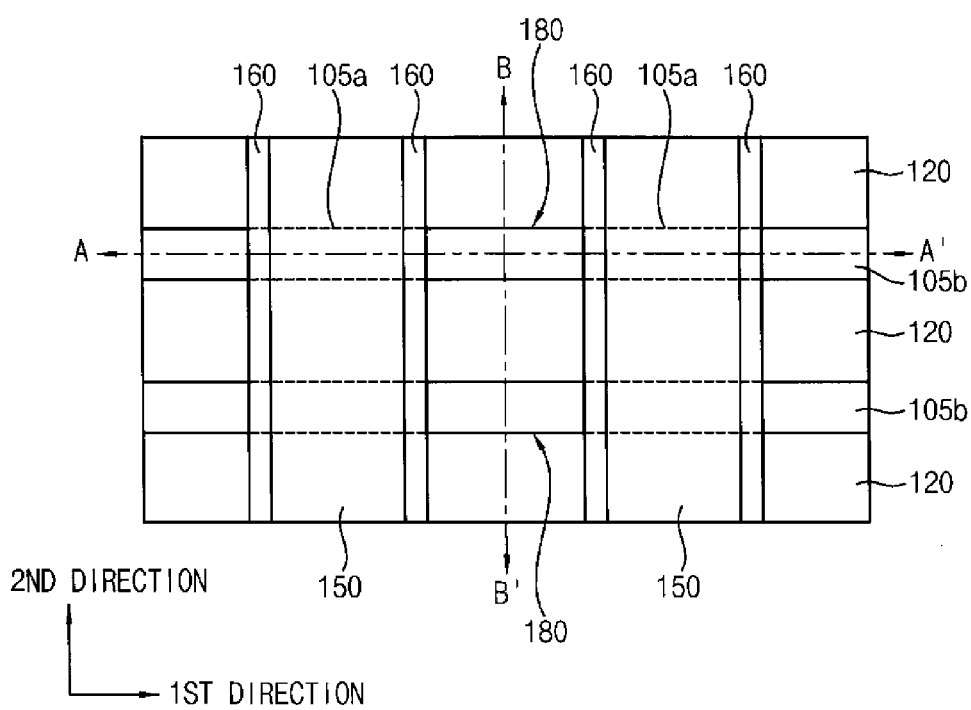
Figure 16:
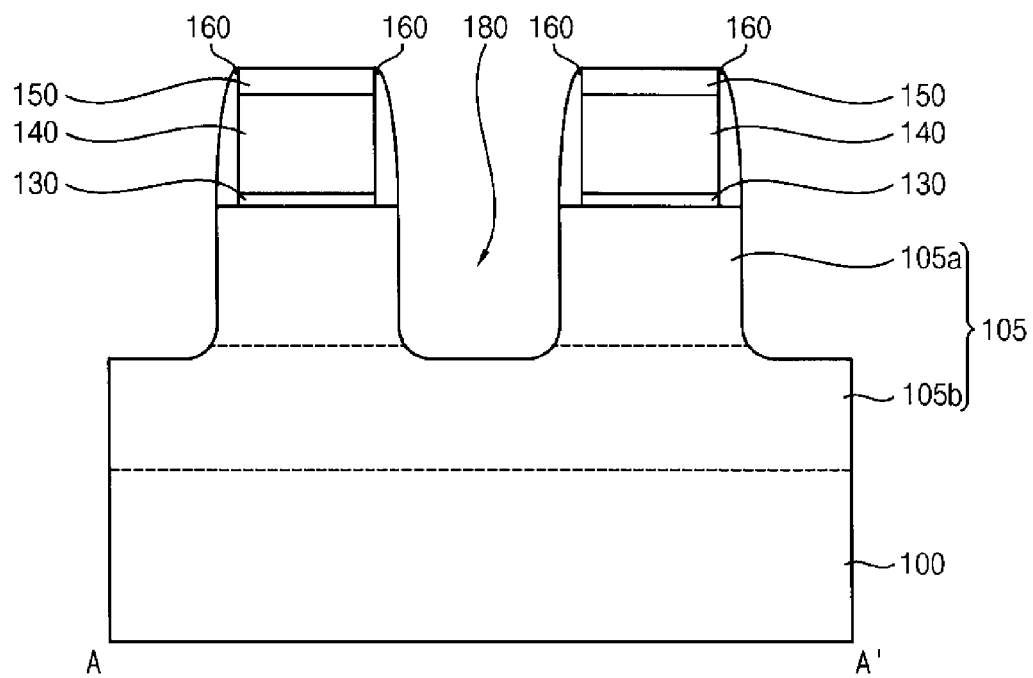
Figure 17:
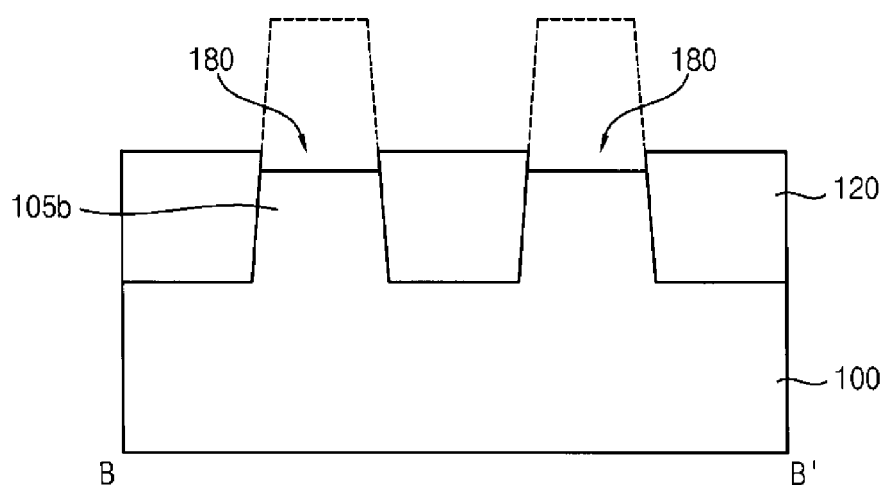

Referring to FIGS. 15 to 17, a portion of the active fin 105 of the substrate 100 may be etched using the dummy gate structure and the gate spacer 160 as an etching mask to form a recess 180.

That is, the recess 180 may be formed by removing part of the upper portion 105a of the active fin 105 and part of the lower portion 105b of the active fin 105, for example. Thus, the bottom of the recess 180 may be situated at a level below the level of the top of the lower portion 105b of the active fin 105.

Figure 18:
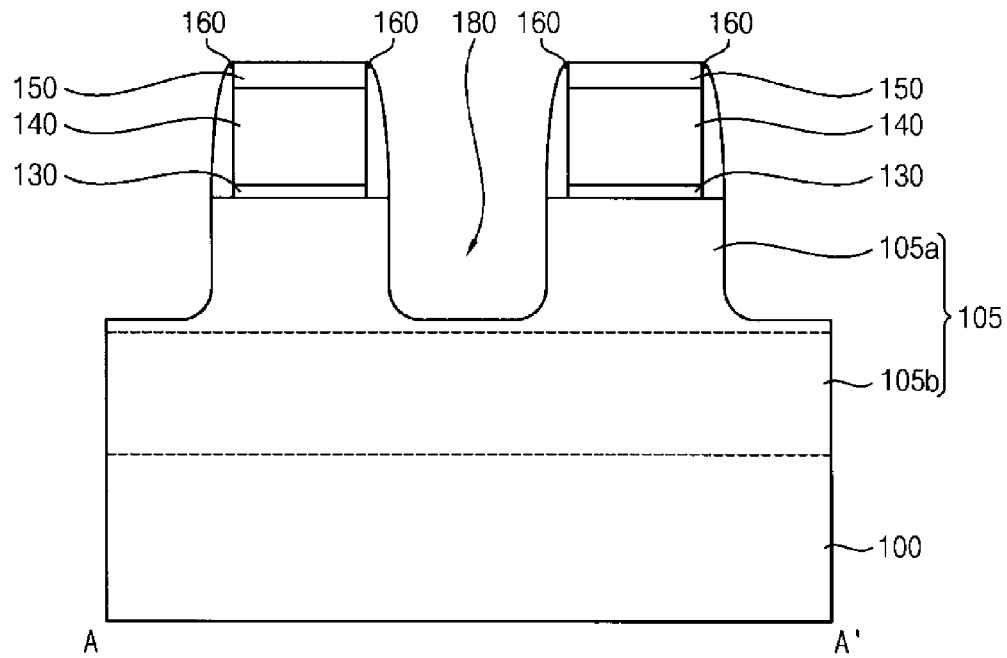

Alternatively, referring to FIG. 18, the recess 180 may be formed by removing only a part of the upper portion 105a of the active fin 105. In this case, the bottom of the recess 180 may be situated at a level higher than that of the bottom of the upper portion 105a of the active fin 105.

Hereinafter, for convenience, only the case in which the bottom of the recess 180 is lower than the top surface of the lower portion 105b of the active fin 105 will be illustrated.

Figure 19:
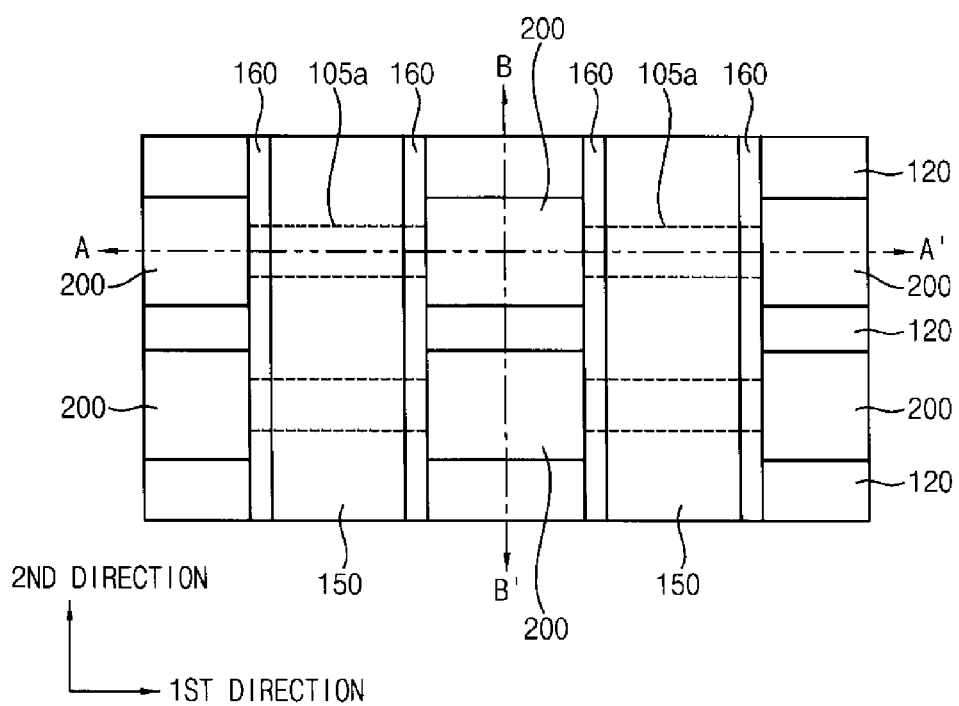
Figure 20:
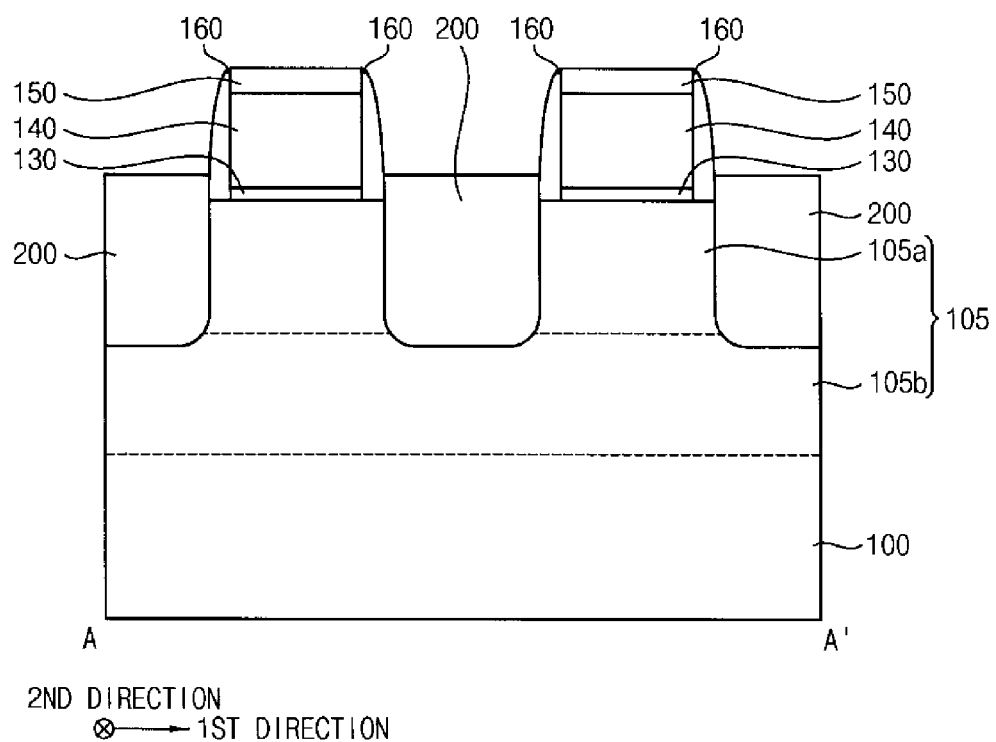
Figure 21:
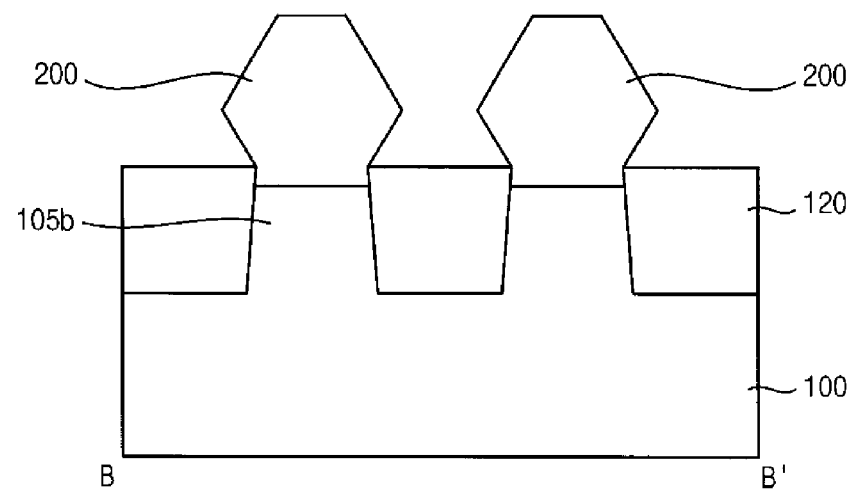

Referring to FIGS. 19 to 21, an epitaxial layer 200 may be formed on the active fin 105 to fill the recess 180.

For example, the epitaxial layer 200 may be formed by a selective epitaxial growth (SEG) process using a portion of the active fin 105 exposed by the recess 180 as a seed, i.e., a top surface of the lower portion 105b of the active fin 105 and side surfaces of the upper portion 105a of the active fin 105.

The SEG process may be performed using a silicon source gas, e.g., disilane ($Si_2H_6$), to form a single crystalline silicon layer. An n-type impurity source gas, e.g., phosphine ($PH_3$), may be also used to form a single crystalline silicon layer doped with n-type impurities. Alternatively, the SEG process may be performed using a silicon source gas, e.g., disilane ($Si_2H_6$) and a carbon source gas, e.g., monomethylsilane ($SiH_3CH_3$), to form a single crystalline silicon carbide layer. In one example, an n-type impurity source gas, e.g., phosphine ($PH_3$), is also used to form a single crystalline silicon carbide layer doped with n-type impurities.

In other examples, the SEG process is performed using a silicon source gas, e.g., dichlorosilane ($SiH_2Cl_2$), a germanium source gas, e.g., germane ($GeH_4$), to form a single crystalline silicon-germanium layer. A p-type impurity source gas, e.g., diborane ($B_2H_6$), may be also used to form a single crystalline silicon-germanium layer doped with p-type impurities.

The epitaxial layer 200, which may be a single crystalline silicon layer doped with n-type impurities, a single crystalline silicon carbide layer doped with n-type impurities, or a single crystalline silicon-germanium layer doped with p-type impurities, may grow both in vertical and horizontal directions so that the cross section of an upper portion of the epitaxial layer 200, taken along the second direction, may have the shape of a pentagon or hexagon.

The epitaxial layer 200 may fill the recess 180 and cover a lower sidewall of the gate pacer 160.

An ion implantation process may be further performed to form an impurity region (not shown) in the active fin 105. In this case, the impurity region may be formed by doping the active fin 105 with n-type impurities, e.g., phosphorus, arsenic, or the like. The ion implantation process may be performed using the dummy gate structure and the gate spacer 160 as an ion implantation mask, and an annealing process may be further performed to the cause the impurities to diffuse to neighboring regions of the active fin 105.

Thus, the impurities may be implanted into the epitaxial layer 200 and a portion of the active fin 105 under the epitaxial layer 200, and hereinafter, only the portion of the active fin 105 doped with the impurities will be referred to as the impurity region. The epitaxial layer 200 and the impurity region may serve as a source/drain region of a negative-channel metal oxide semiconductor (NMOS) transistor.

In other examples, the impurity region is formed by doping the active fin 105 with p-type impurities, e.g., boron, aluminum, or the like, in which case the epitaxial layer 200 and the impurity region may serve as a source/drain region of a positive-channel metal oxide semiconductor (PMOS) transistor.

Figure 22:
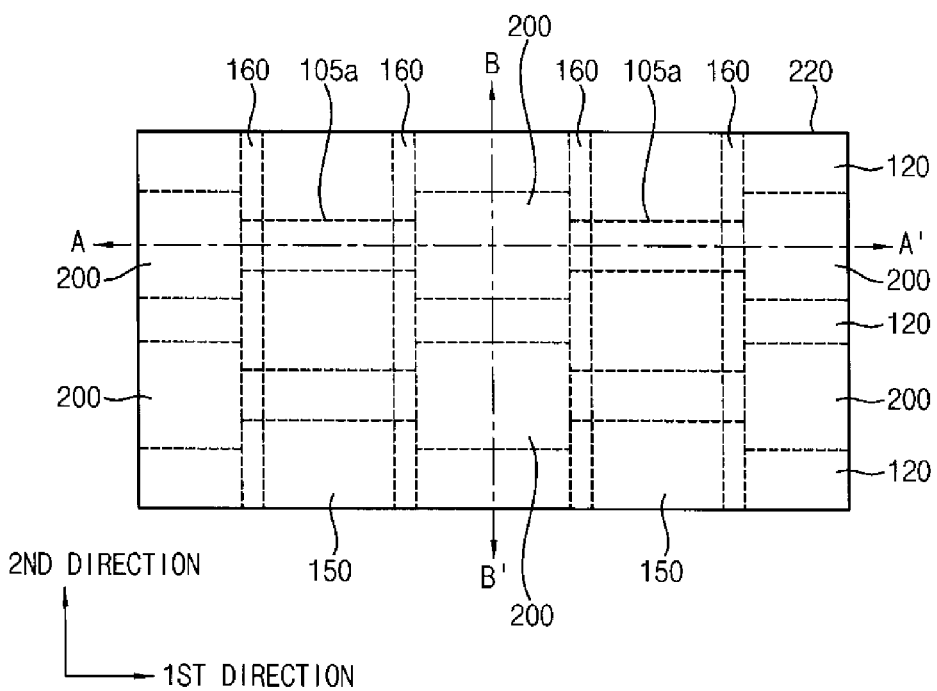
Figure 23:
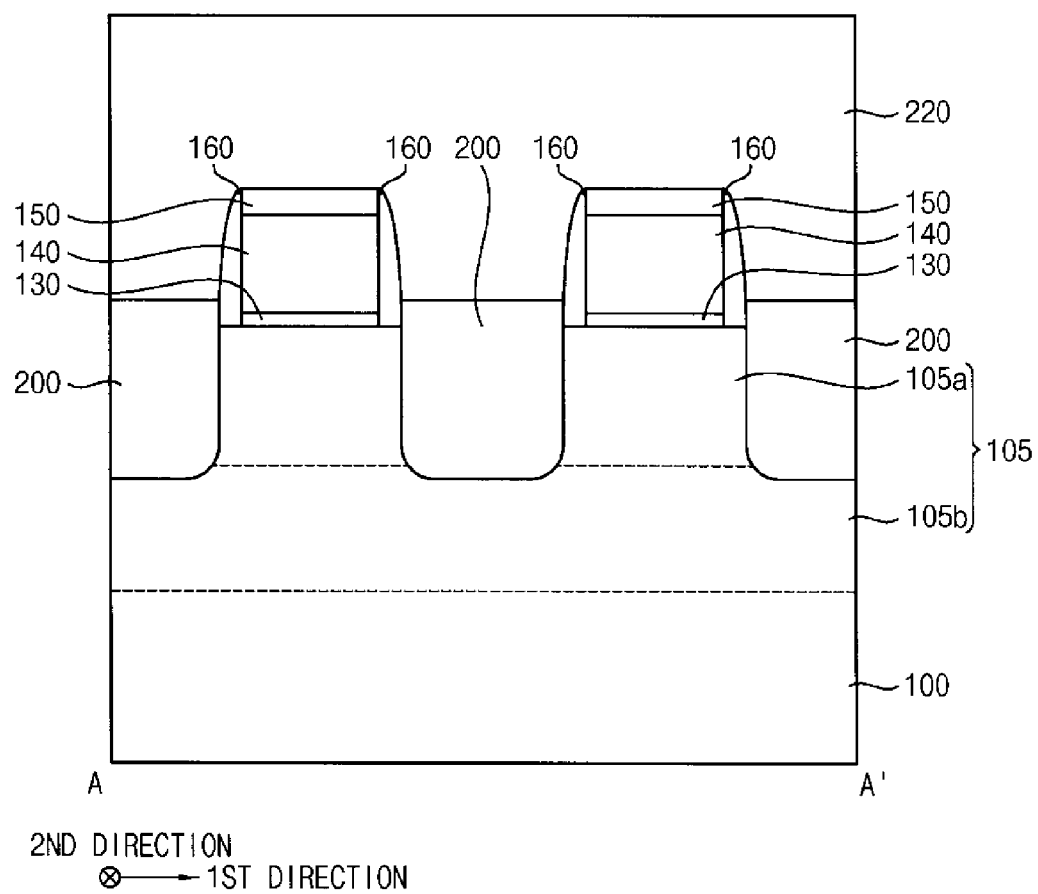
Figure 24:
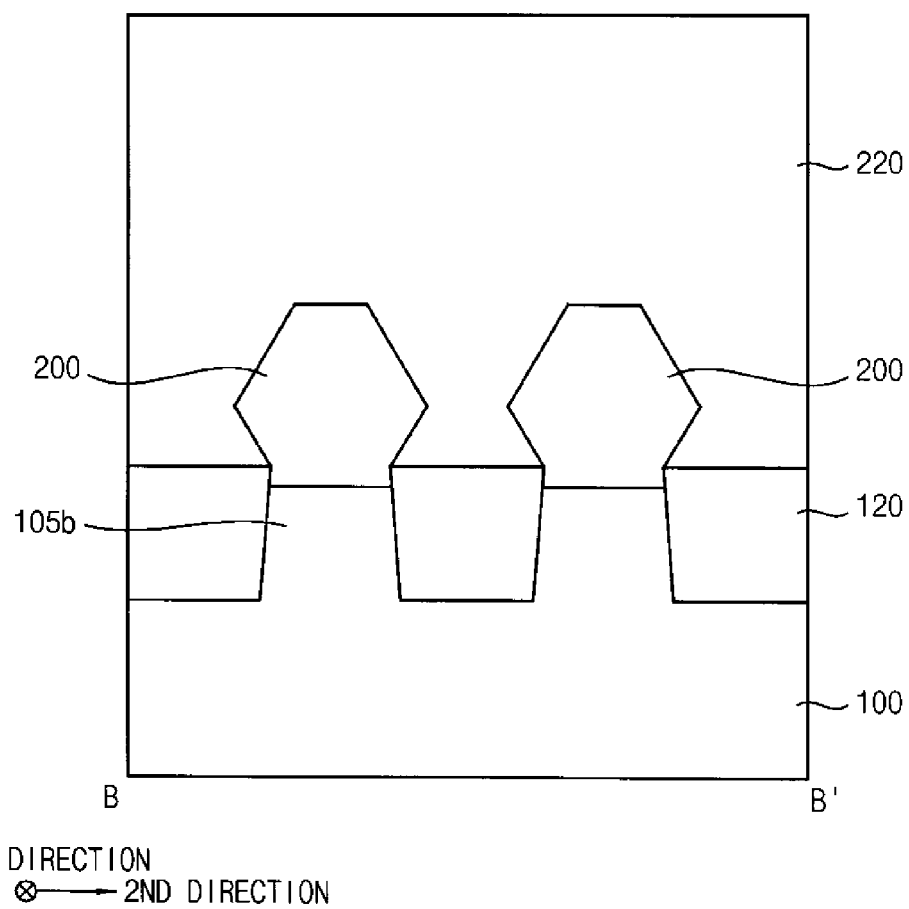

Referring to FIGS. 22 to 24, a first insulating interlayer 220 may be formed on the dummy gate structure, the gate spacer 160, the epitaxial layer 200 and the isolation layer 120 to have a top surface above the level of that of the dummy gate structure. The first insulating interlayer 220 may be formed of an oxide, e.g., silicon oxide.

Figure 25:
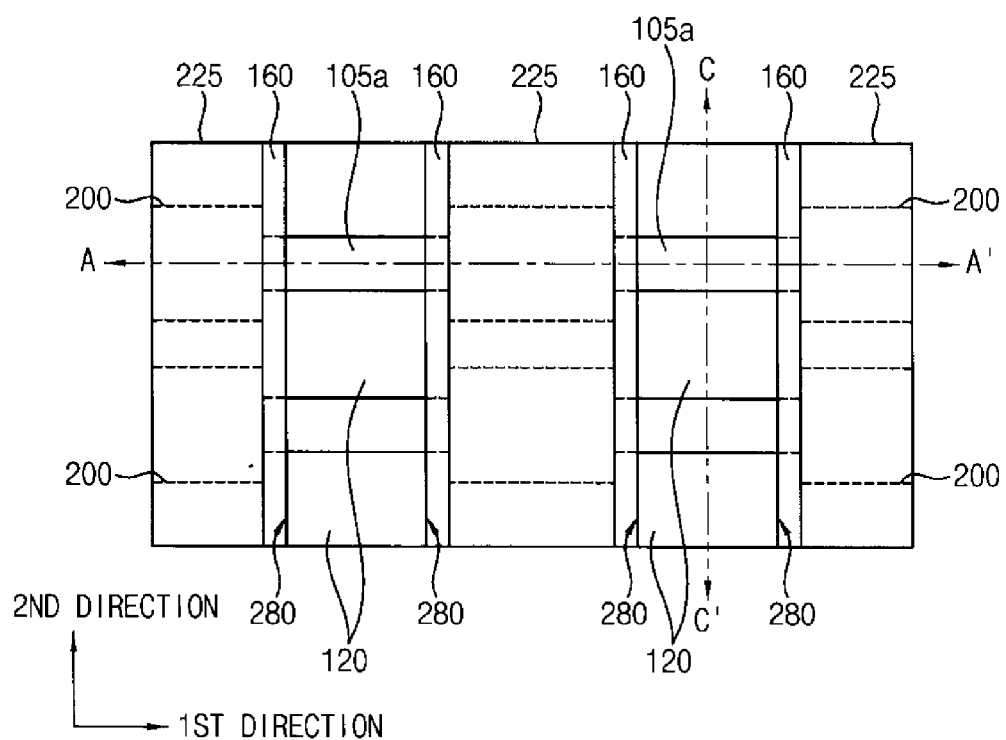
Figure 26:
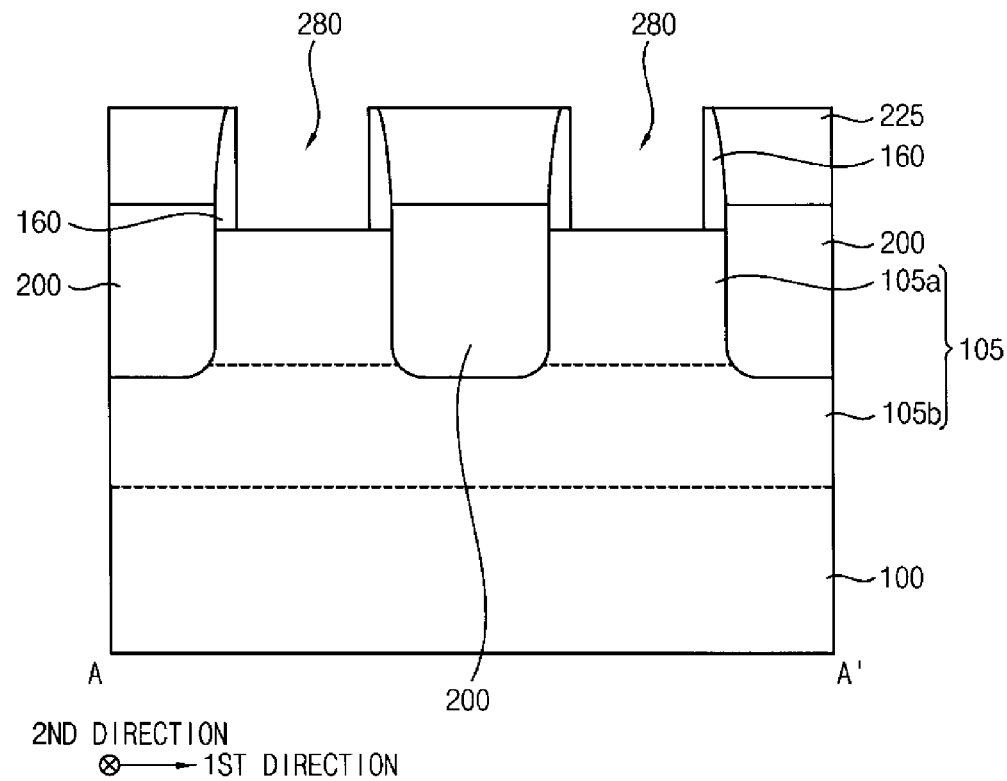
Figure 27:
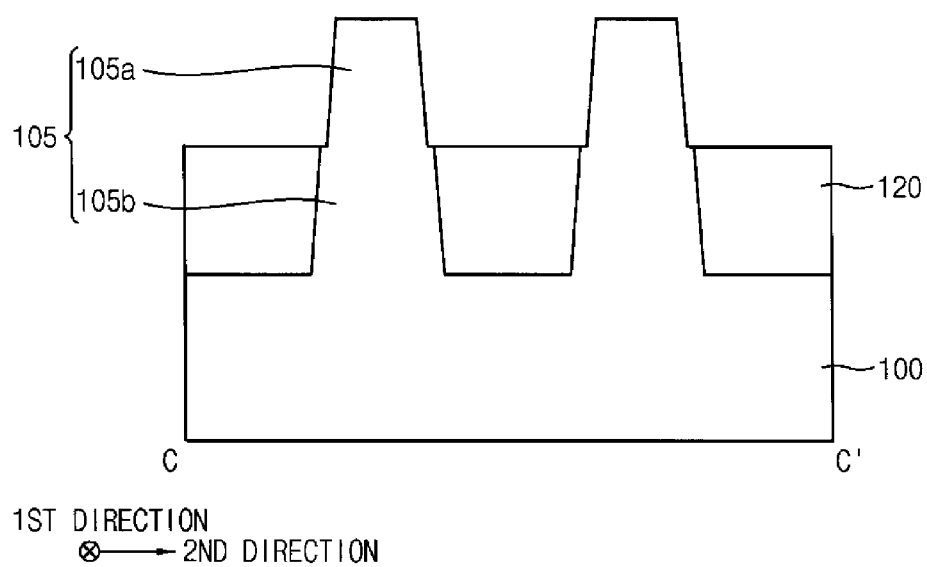

Referring to FIGS. 25 to 27, the first insulating interlayer 220 may be planarized until a top surface of the dummy gate electrode 140 of the dummy gate structure is exposed to form a first insulating interlayer pattern 225.

The planarization process may be performed by a chemical mechanical polishing (CMP) process and/or an etch back process. In the planarization process, the dummy gate mask 150 and an upper portion of the gate spacer 160 may be also removed.

The exposed dummy gate electrode 140 and the dummy gate insulation layer pattern 130 under the dummy gate electrode 140 may be removed to form an opening 280 exposing a top surface of the active fin 105 of the substrate 100 and a top surface of the isolation layer 120.

For example, the exposed dummy gate electrode 140 is removed by a dry etch process first, and then a wet etch process. The wet etch process may be performed using ammonia hydroxide ($NH_4OH$) as an etching solution.

Figure 28:
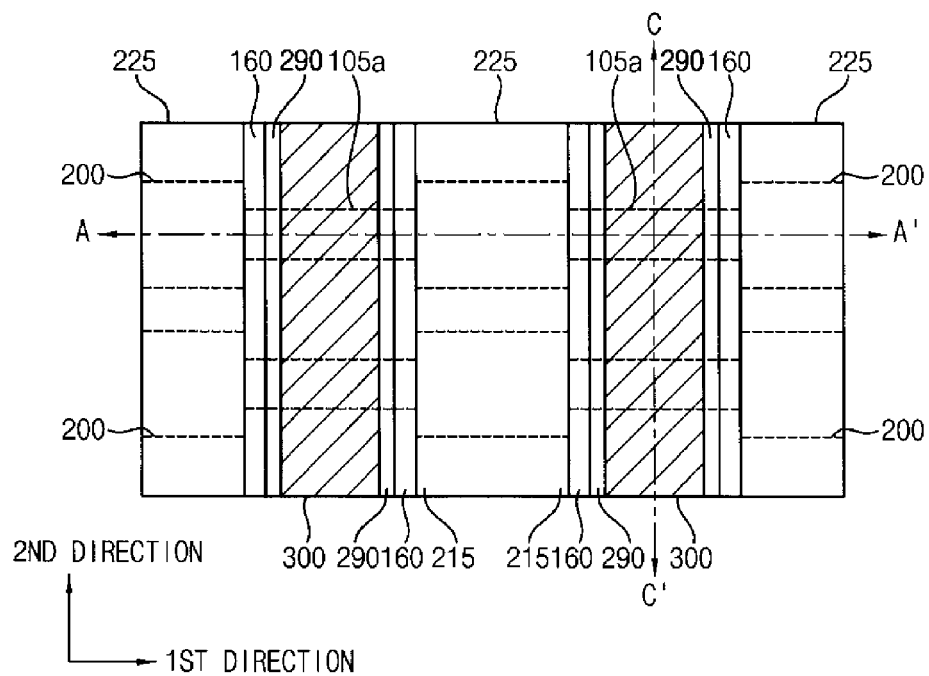
Figure 29:
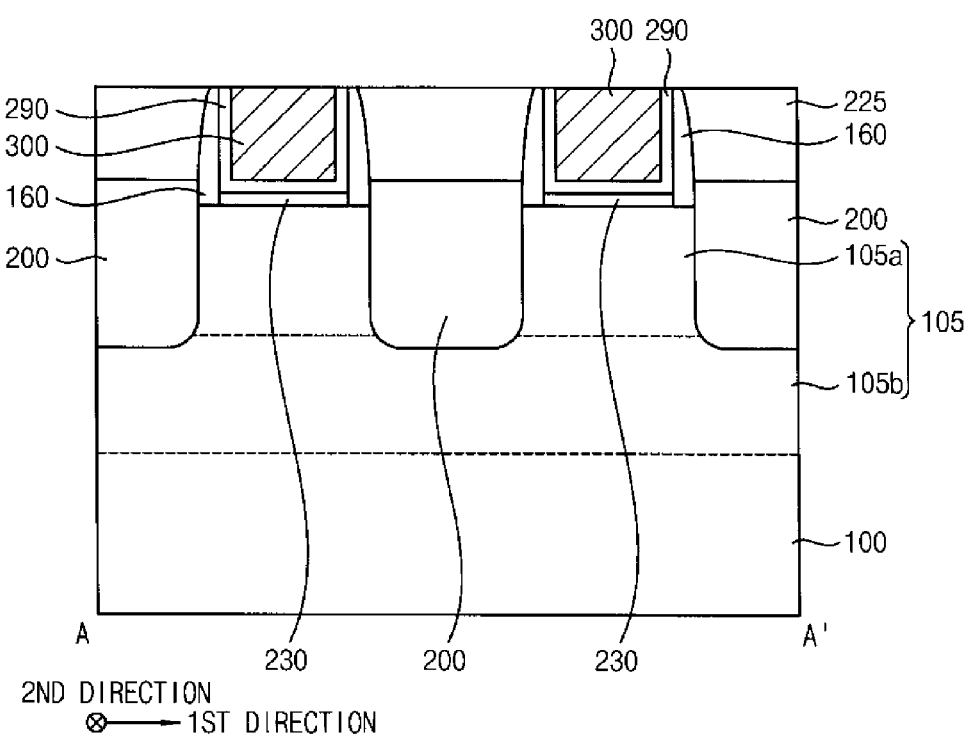
Figure 30:
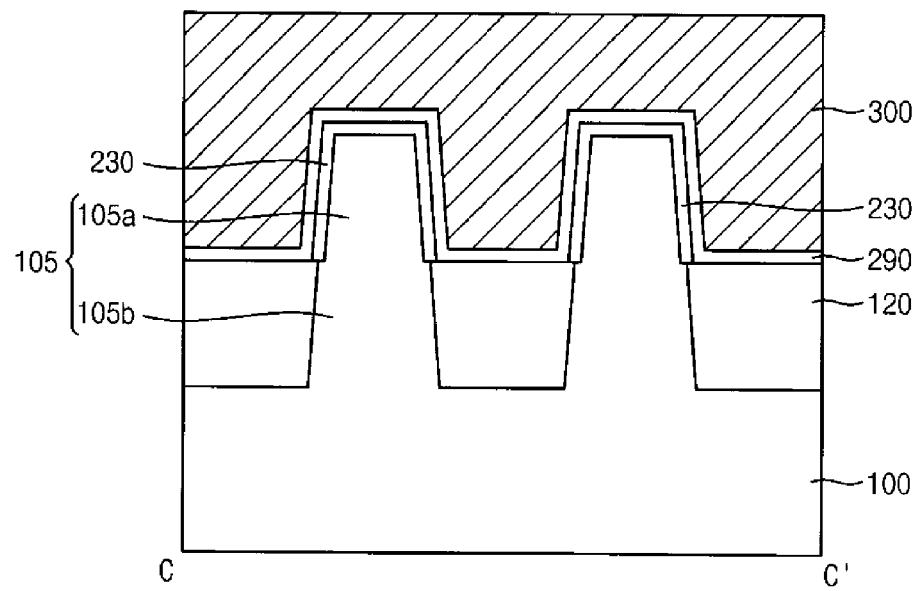
Figure 31:
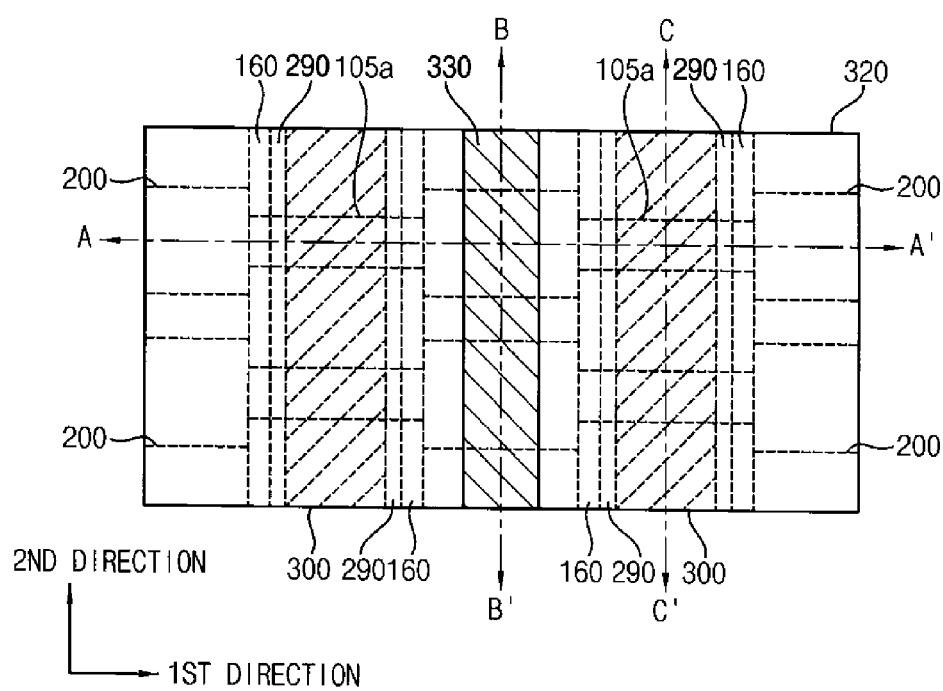
Figure 32:
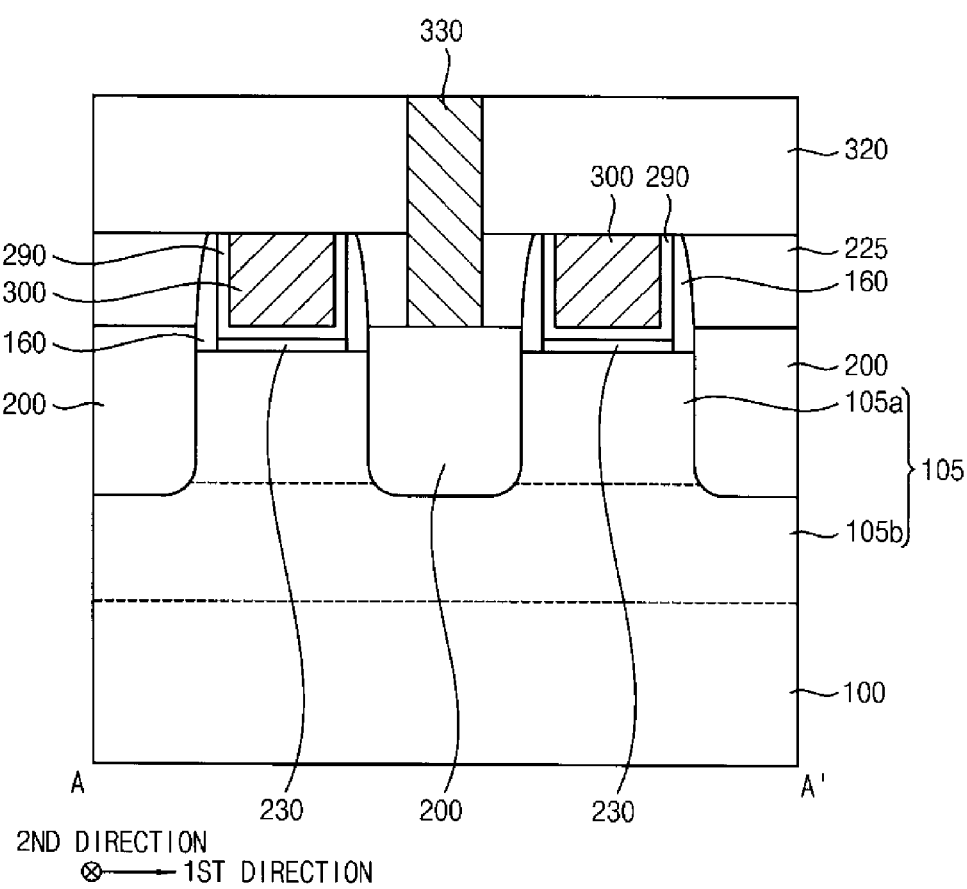
Figure 33:
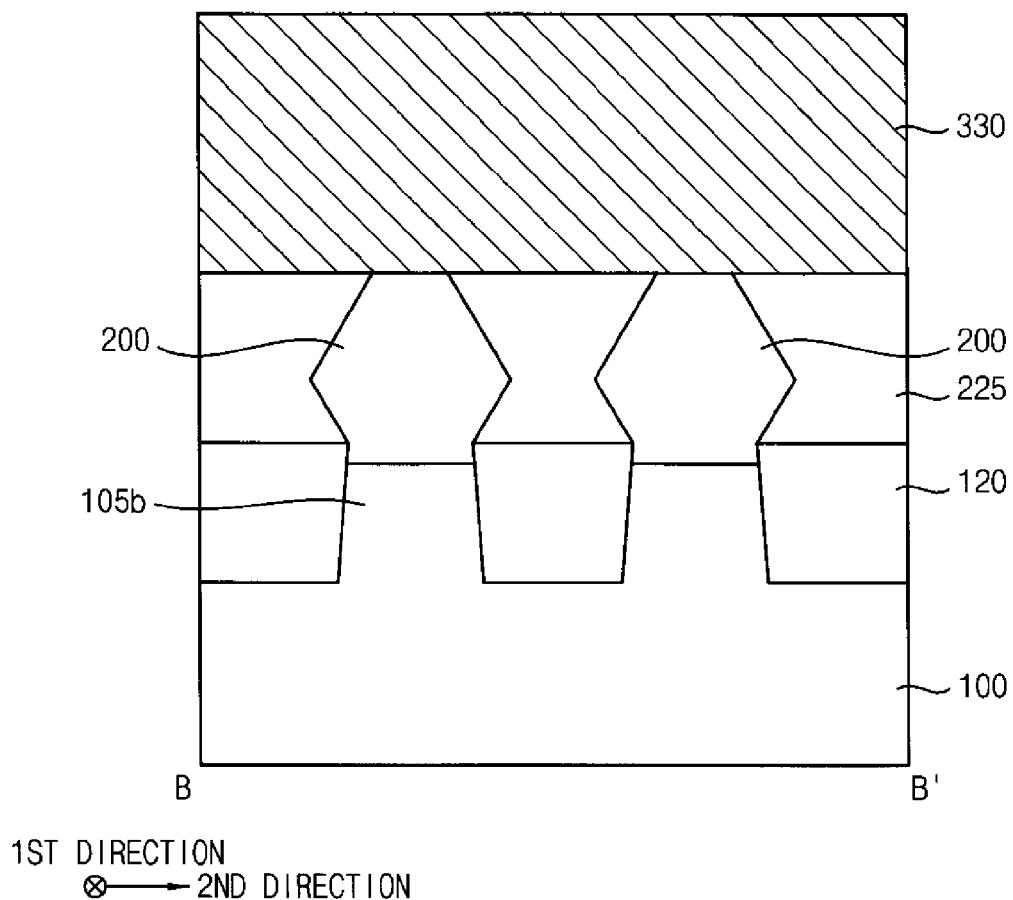
Figure 34:
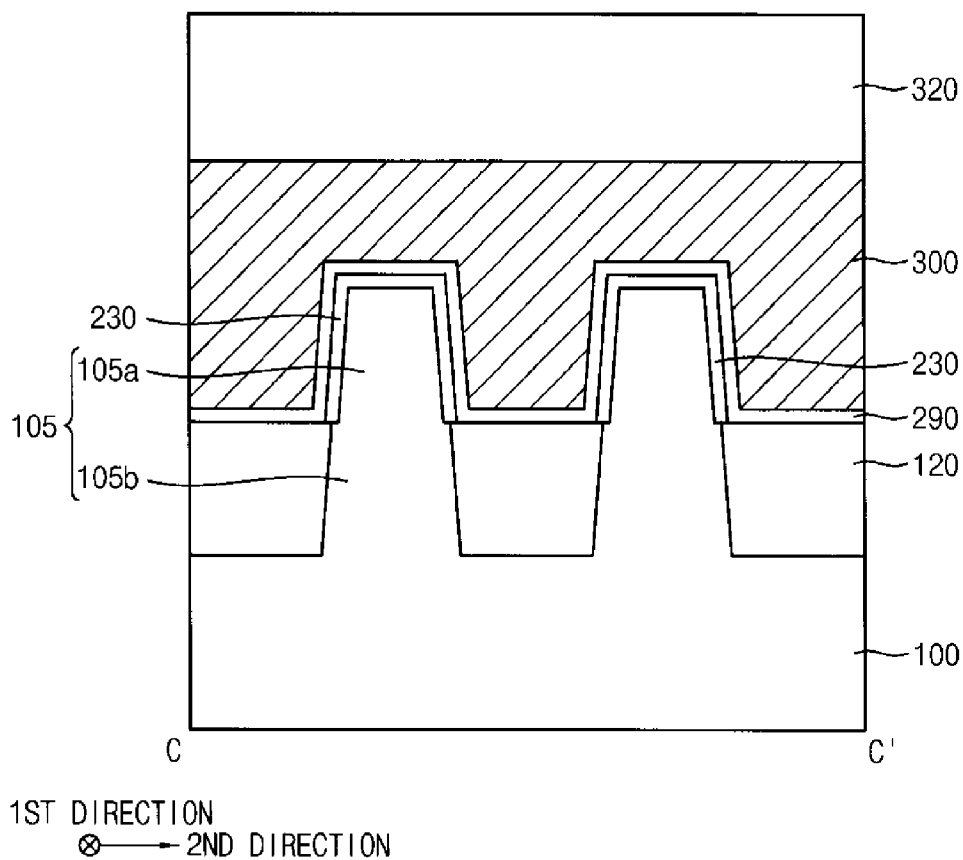

Referring to FIGS. 28 to 30, an interface layer pattern 230, a gate insulation layer pattern 290 and a gate electrode 300 may be sequentially formed to fill the opening 280.

In this example, the top surface of the active fin 105 of the substrate 100 exposed by the opening 280 may be subjected to a thermal oxidation process to form the interface layer pattern 230. In another example, the interface layer pattern 230 is omitted.

A gate insulation layer may be formed on a top surface of the interface layer pattern 230, on a top surface of the isolation layer 120, along sides of the opening 280, and on a top surface of the first insulating interlayer pattern 225, and a gate electrode layer may be formed on the gate insulation layer to substantially fill a remaining portion of the opening 280.

The gate insulation layer is formed according to the inventive concept, e.g., using the method of forming a layer shown in and described with reference to FIGS. 1 to 3. That is, the gate insulation layer may be formed by an ALD process using a traveling wave type ALD apparatus, and the ALD process may comprise first to third steps including 8 ALD cycles, 6 ALD cycles and 6 ALD cycles, respectively. The first step may be performed while the substrate 100 is at the home position, the second step may be performed while the substrate 100 is at a second relative angular position rotated by an angle of about 120 degrees from the home position, and the third step may be performed while the substrate 100 is at a third relative angular position rotated at an angle of about 240 degrees from the home position. Thus, the gate insulation layer may have a uniform thickness.

The gate insulation layer may be formed of a metal oxide having a high dielectric constant, e.g., hafnium oxide, tantalum oxide, zirconium oxide, or the like.

The gate electrode layer may be formed of material having a low resistance, e.g., a metal such as aluminum, copper, tantalum, etc., or a metal nitride thereof by an ALD process, a physical vapor deposition (PVD) process, or the like. When the gate electrode layer is formed by ALD, it may be formed using a method shown in and described with reference to FIGS. 1 and 2, similarly to the gate insulation layer.

A heat treatment process, e.g., a rapid thermal annealing (RTA) process, a spike rapid thermal annealing (spike RTA) process, a flash rapid thermal annealing (flash RTA) process or a laser annealing process may be additionally performed on the gate electrode layer. Alternatively, the gate electrode layer may be formed of doped polysilicon.

The gate electrode layer and the gate insulation layer may be planarized until a top surface of the first insulating interlayer pattern 225 is exposed to form a gate insulation layer pattern 290 extending along the top surface of the interface layer pattern 230, the top surface of the isolation layer 120, and the sides of the opening 280. The gate electrode 300 may be formed on the gate insulation layer pattern 290 to fill the remaining portion of the opening 280. Accordingly, a bottom surface and side surfaces of the gate electrode 300 may be covered by the gate insulation layer pattern 290. The planarization process may be performed by a CMP process and/or an etch back process.

The interface layer pattern 230, the gate insulation layer pattern 290, and the gate electrode 300 sequentially stacked may form a gate structure, and the gate structure and the source/drain region may constitute an NMOS transistor or a PMOS transistor.

Referring to FIGS. 31 to 34, a second insulating interlayer 320 may be formed on the first insulating interlayer pattern 225 to cover the transistor, and a contact plug 330 may be formed through the second insulating interlayer 320 and the first insulating interlayer pattern 225 to contact a top surface of the epitaxial layer 200.

In one example, the contact plug 330 is formed by forming an opening (not shown) through the second insulating interlayer 320 and the first insulating interlayer pattern 225, forming a conductive layer on the exposed top surface of the epitaxial layer 200 and the second insulating interlayer 320 to fill the opening, and planarizing the conductive layer until a top surface of the second insulating interlayer 320 is exposed.

The contact plug 330 may be formed to extend in the second direction. Alternatively, a plurality of contact plugs 330 may be formed on the top surfaces of the epitaxial layers 200, respectively, in the second direction.

The above-described method of forming a layer and the method of manufacturing the semiconductor device using the same may be applied to the manufacturing of various types of memory devices including a layer formed by an ALD process. For example, the method of forming the layer and the method of manufacturing the semiconductor device may be applied to methods of manufacturing logic devices such as central processing units (CPUs), main processing units (MPUs), application processors (APs), or the like. Additionally, the method of forming the layer and the method of manufacturing the semiconductor device may be applied to methods of manufacturing volatile memory devices such as DRAM devices or SRAM devices, or non-volatile memory devices such as flash memory devices, PRAM devices, MRAM devices, RRAM devices, or the like.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:
1. A method of forming a layer, the method comprising:
   loading a substrate into a chamber and setting the substrate at a first relative angular position in the chamber;

performing a cycle n times while the substrate is held at the first relative angular position, the cycle including:
supplying source gas onto the substrate from a first location adjacent an outer periphery of the substrate,
purging the chamber,
supplying reaction gas onto the substrate from the first location, and
purging the chamber;
setting the substrate at a second relative angular position in the chamber at which the substrate is rotated by x degrees from the first relative angular position; and
performing the cycle m times while the substrate is held at the second relative angular position,
wherein n is a natural number greater than 1, x is a real number greater than 0 and less than 360, and m is a natural number equal to at least 1 but less than n.

2. The method of claim 1, wherein x is 180.

3. The method of claim 2, wherein n is 11, 12 or 13, and wherein m is 7, 8 or 9.

4. The method of claim 1, wherein x is 120, and the method further comprises performing the cycle m times with the substrate at a third relative angular position at which the substrate is rotated about 240 degrees from the first relative angular position.

5. The method of claim 4, wherein n is 8, and wherein m is 6.

6. The method of claim 1, wherein the cycle comprises directing the source gas and the reaction gas to flow diametrically across a surface of the substrate.

7. The method of claim 1, wherein the source gas comprises hafnium or zirconium.

8. The method of claim 7, wherein the source gas comprises hafnium chloride ($HfCl_4$) or zirconium chloride ($ZrCl_4$).

9. The method of claim 1, wherein the reaction gas comprises water vapor ($H_2O$).

10. The method of claim 1, wherein the purging of the chamber after supplying the source gas and after the supplying of the reaction gas during each said cycle comprises purging the chamber with inactive gas.

11. A method of forming a layer, the method comprising steps of:
i) setting a substrate at a first relative angular position in a process chamber;
ii) performing a cycle n times while the substrate is set at the first relative angular position in the process chamber,
the cycle including sequentially supplying, from a first location adjacent a periphery of the substrate, source gas, first purge gas, reaction gas, and second purge gas onto the substrate, wherein n is a natural number greater than 1; and
iii) rotating the substrate $\{(360/a)\times(b)\}$ degrees to another relative angular position in a direction from the home position, and performing the cycle m times with the substrate set at the another relative angular position, wherein m is a natural number equal to at least 1 but less than n, a is a natural number greater than 1, and b is a natural number equal to at least 1, and
wherein step iii) is repeated until step iii) has been performed (a−1) times.

12. The method of claim 11, wherein step ii) comprises directing the source gas, the first purge gas, the reaction gas and the second purge gas from the first location toward a second location diametrically across the substrate opposite from the first location.

13. The method of claim 11, wherein the source gas comprises hafnium or zirconium.

14. The method of claim 11, wherein the reaction gas comprises water vapor ($H_2O$).

15. The method of claim 11, wherein the first and second purge gases are substantially the same.

16. A method of forming a layer, the method comprising steps of:
i) positioning a substrate at a home position in a process chamber, the substrate being at a first relative angular position when in the home position;
ii) performing a number "n" of atomic layer deposition (ALD) cycles while the substrate remains fixed at said home position in the process chamber;
iii) subsequently repositioning the substrate in the process chamber to another relative angular position at which the substrate is rotated about a geometrically central point of the substrate by an angle of x degrees relative to the home position; and
iv) performing a number "m" of said ALD cycles while the substrate remains fixed at said another relative angular position in the process chamber,
wherein n is a natural number greater than 1, x is greater than 0 and less than 360, and m is a natural number greater than one and not greater than n.

17. The method of claim 16, wherein m is less than n.

18. The method of claim 16, wherein the step iii) of repositioning of the substrate comprises rotating the substrate, about the geometrically central point of the substrate, by an angle of $x=\{(360/a)\times(b)\}$ degrees, wherein a is a natural number greater than 1, and b is a natural number equal to at least 1, and
wherein steps iii) and iv) are repeated in sequence until the sequence of steps iii) and iv) has been performed (a−1) number of times.

19. The method of claim 18, wherein m is less than n each time step iii) is performed.

20. The method of claim 18, wherein each of the ALD cycles includes supplying source gas onto the substrate, subsequently purging the process chamber, subsequently supplying reaction gas onto the substrate from the first location, and subsequently purging the process chamber.

* * * * *